United States Patent
Ahmad et al.

(10) Patent No.: US 12,412,310 B2
(45) Date of Patent: Sep. 9, 2025

(54) ENCODING DATA MATRICES INTO COLOR CHANNELS OF IMAGES USING NEURAL NETWORKS AND DEEP LEARNING

(71) Applicant: REZOLVE LTD., London (GB)

(72) Inventors: Salman Ahmad, Leicester (GB); Daniel Maurice Wagner, London (GB)

(73) Assignee: Rezolve AI Limited (GB)

( * ) Notice: Subject to any disclaimer, the term of this patent is extended or adjusted under 35 U.S.C. 154(b) by 411 days.

(21) Appl. No.: 17/981,729

(22) Filed: Nov. 7, 2022

(65) Prior Publication Data

US 2024/0153146 A1    May 9, 2024

(51) Int. Cl.
*G06T 9/00* (2006.01)
*G06F 9/30* (2018.01)
(Continued)

(52) U.S. Cl.
CPC ............ *G06T 9/00* (2013.01); *G06F 9/30036* (2013.01); *G06F 11/00* (2013.01); *G06F 11/08* (2013.01);
(Continued)

(58) Field of Classification Search
CPC . G06T 2207/10024; G06T 2207/20084; G06T 1/0021; G06T 11/001; G06T 11/00; G06T 3/4092; G06T 3/4053; G06T 9/00; G06T 11/40; G06T 5/60; G06T 9/002; G06T 1/0028; G06T 1/0092; G06T 1/0085; G06T 1/0078; G06T 1/0071;
(Continued)

(56) References Cited

U.S. PATENT DOCUMENTS

2012/0281871 A1  11/2012 Reed et al.
2016/0352457 A1* 12/2016 Uliana ............... H03M 13/1102
(Continued)

FOREIGN PATENT DOCUMENTS

CN    111738899 A  * 10/2020  ........... G06T 1/0021
CN    114666619 A  *  6/2022  ....... H04N 21/23418
(Continued)

OTHER PUBLICATIONS

Search machine translation of CN-111738899-A to Sun et al., Method, Device, Device and Computer Readable Medium for Generating Watermark, translated Feb. 15, 2025, 12 pages. (Year: 2025).*

(Continued)

*Primary Examiner* — Henok Shiferaw
*Assistant Examiner* — Dennis Rosario
(74) *Attorney, Agent, or Firm* — Foley & Lardner LLP

(57) ABSTRACT

Provided herein are systems and methods of encoding messages into images. At least one server can identify a first image having a first plurality of pixels in a color space having a set of channels. The at least one server can generate, using a message to encode in the first image, a data matrix identifying a plurality of values. The at least one server can apply a machine learning (ML) model comprising a plurality of convolutional layers to the first image and to the data matrix to generate a second image having a second plurality of pixels in the color space. The second image can correspond to the first image encoded with the data matrix across the set of channels in the color space.

12 Claims, 14 Drawing Sheets

(51) Int. Cl.
| | |
|---|---|
| *G06F 11/00* | (2006.01) |
| *G06F 11/08* | (2006.01) |
| *G06F 17/16* | (2006.01) |
| *G06K 7/14* | (2006.01) |
| *G06N 3/0464* | (2023.01) |
| *G06N 20/00* | (2019.01) |
| *G06T 1/00* | (2006.01) |
| *G06T 5/60* | (2024.01) |
| *G06T 7/11* | (2017.01) |
| *G06T 7/90* | (2017.01) |
| *G06V 10/70* | (2022.01) |
| *G06V 10/74* | (2022.01) |
| *G06V 10/82* | (2022.01) |
| *H03M 13/00* | (2006.01) |
| *H03M 13/11* | (2006.01) |
| *H03M 13/37* | (2006.01) |

(52) U.S. Cl.
CPC ........... *G06F 17/16* (2013.01); *G06K 7/1473* (2013.01); *G06N 3/0464* (2023.01); *G06N 20/00* (2019.01); *G06T 1/0021* (2013.01); *G06T 5/60* (2024.01); *G06T 7/11* (2017.01); *G06T 7/90* (2017.01); *G06V 10/70* (2022.01); *G06V 10/761* (2022.01); *G06V 10/82* (2022.01); *H03M 13/00* (2013.01); *H03M 13/1105* (2013.01); *H03M 13/37* (2013.01); *H03M 13/61* (2013.01); *H03M 13/616* (2013.01); *G06T 2207/10024* (2013.01); *H04L 2209/34* (2013.01)

(58) Field of Classification Search
CPC ..... G06T 1/0064; G06T 1/0057; G06T 1/005; G06T 1/0042; G06T 1/0035; G06T 7/11; G06T 7/90; G06T 2201/0052; G06T 2201/005; G06T 2201/0051; G06T 2201/0053; G06T 2201/0061; G06T 2201/0063; G06T 2201/0062; G06T 2201/0064; G06T 2201/0065; G06T 2201/0081; G06T 2201/0083; G06T 2201/0201; G06T 2201/0203; G06T 2201/0202; G06T 2201/0601; G06T 3/4046; G06T 2207/20081; G06N 20/00; G06N 3/0464; G06N 3/02; G06N 3/0455; G06N 3/04; G06N 3/0409; G06N 3/0418; G06N 3/042; G06N 3/043; G06N 3/044; G06N 3/0442; G06N 3/045; G06N 3/0463; G06N 3/047; G06N 3/0475; G06N 3/048; G06N 3/049; G06N 3/0495; G06N 3/0499; G06N 3/08; G06N 3/082; G06N 3/084; G06N 3/086; G06N 3/088; G06N 3/0895; G06N 3/09; G06N 3/091; G06N 3/094; G06N 3/092; G06N 3/096; G06N 3/098; G06N 3/0985; G06N 20/10; G06N 20/20; G06N 5/04; H04N 19/146; H04N 19/467; H04N 19/463; H04N 19/156; H04N 19/517; H04N 21/23892; H04N 21/8358; H04N 19/186; H04N 19/46; H04N 19/00; H04N 1/3232; H04N 1/32149; H04N 1/32144; H04N 1/32331; H04N 1/32336; H04N 1/32347; H04N 19/126; G01J 3/462; G06V 10/70; G06V 10/82; G06V 10/56; G06V 10/467; G06V 10/454; G06V 10/761; G06F 17/16; G06F 9/0036; G06F 12/0207; G06F 11/00; G06F 2201/00; G06F 11/1048; G06F 11/106; G06F 11/08; G06F 11/1044; G06F 2212/403; G06F 2207/4824; H03M 13/00; H03M 13/25; H03M 13/03; H03M 13/31; H03M 13/47; H03M 13/49; H03M 13/61; H03M 13/616; H03M 13/615; H03M 13/63; H03M 13/6312; H03M 13/1102; H03M 13/1105; H03M 13/1515; H03M 13/151; H03M 13/154; H03M 13/116; H03M 13/1154; H03M 13/1151; H03M 13/1162; H03M 13/1171; H03M 13/1174; H03M 13/1177; H03M 13/118; H03M 13/1182; H03M 13/1185; H03M 13/1148; H03M 13/1157; H03M 13/1168; H03M 13/1165; H03M 13/1188; H03M 13/611; H03M 13/37; H03M 13/156; H03M 13/1565; H03M 13/1575; H03M 13/19; H03M 13/17; H03M 13/21; H03M 13/235; H03M 13/255; H03M 13/2921; H03M 13/2924; H03M 13/2927; H03M 13/2903; H03M 13/2778; H03M 13/2948; G06K 7/1417; G06K 19/06037; G06K 19/06056; G06K 19/06075; G06K 7/1473; G06K 7/1443; G06K 7/1413; G06K 7/1408; G06K 7/1404; H04L 2209/34; H04L 49/557; H04L 49/55
See application file for complete search history.

(56) References Cited

U.S. PATENT DOCUMENTS

| | | |
|---|---|---|
| 2020/0250513 A1 | 8/2020 | Krishnamoorthy |
| 2022/0025428 A1* | 1/2022 | Hughes ............... G11C 13/0019 |
| 2023/0343119 A1* | 10/2023 | Kirsten ................ G06V 30/133 |

FOREIGN PATENT DOCUMENTS

| | | | | |
|---|---|---|---|---|
| GB | 2372245 A | * | 8/2002 | ............... B07C 1/06 |
| WO | WO-2018064203 A1 | * | 4/2018 | ....... G06K 19/06037 |

OTHER PUBLICATIONS

Search machine translation of CN-114666619-A to Yuan, Watermarking Treated of Video File, Device, Device and Storage Medium, translated Feb. 15, 2025, 16 pages. (Year: 2025).*

El'arbi Met al: "Video Watermarking Based on Neural Networks", Proceedings/ 2006 IEEE International Conference on Multimedia and Expo, ICME 2006 : Jul. 9-12, 2006, Hilton, Toronto, Toronto, Ontario, Canada, IEEE Service Center, Piscataway, NJ, Jul. 9, 2006 (Jul. 9, 2006), pp. 1577-1580,XP032965058, DOI: 10.1109/ICME. 2006.262846 ISBN : 978-1-4244-0366-0 the whole document.

International Search Report and Written Opinion on PCT application PCT/IB2023/060808 Dated Dec. 14, 2023.

Loganathan Agilandeeswari et al: "An adaptive HVS based video watermarking scheme for multiple watermarks using BAM neural networks and fuzzy inference system", Expert Systems With Applications, Elsevier, Amsterdam, NL, vol. 63,' May 13, 2016 (May 13, 2016), pp. 412-434, XP029682138, ISSN: 0957-4174, DOI: 10.1016/J.ESWA.2016.05.019 abstract.

Olivia Byrnes et al: "Data Hiding with Deep Learning: A Survey Unifying Digital Watermarking and Steganography", arxiv.org, Cornell University Library, 201 Olin Library Cornell University Ithaca, NY 14853, Jul. 20, 2021 (Jul. 20, 2021), XP091013684, the whole document.

* cited by examiner

ENCODING DATA MATRICES INTO COLOR CHANNELS OF IMAGES USING NEURAL NETWORKS AND DEEP LEARNING

BACKGROUND

A computing device can process digital images using computer vision techniques to derive an output.

SUMMARY

The present disclosure is directed to systems and methods to encode images into messages and decode messages from images. A neural network-based encoder model can be used to embed a data matrix into a color channel (e.g., RGB channel) of an image, such that the produced image contains an embedding (e.g., a watermark) that is imperceptible by a human observer. The data matrix can be generated from a message (e.g., a uniform resource locator referencing an information resource) with error correction techniques. The embedding may be presented in segments of the output image to increase the likelihood that the data matrix, and by extension the message, can be recovered from at least one segment. A neural network-based decoder model can be used to extract the data matrix from the encoded image. With the extraction, the message can be reconstructed from the data matrix.

Aspects of the present disclosure are directed to systems and methods to encode messages into images. At least one server can identify a first image having a first plurality of pixels in a color space having a set of channels. The at least one server can generate, using a message to encode in the first image, a data matrix identifying a plurality of values. The at least one server can apply a machine learning (ML) model comprising a plurality of convolutional layers to the first image and to the data matrix to generate a second image having a second plurality of pixels in the color space. The second image can correspond to the first image encoded with the data matrix across the set of channels in the color space.

Aspects of the present disclosure are directed to systems and methods to decode messages from images. At least one server can receive, from a client device, an image having a plurality of pixels in a color space having a set of channels across which a data matrix is encoded, responsive to the client device determining that the image is encoded. At least one server can apply a machine learning (ML) model comprising a plurality of convolutional layers to the image to identify the data matrix decoded from the plurality of pixels of the color space. At least one server can generate a message using a plurality of values of the data matrix decoded from the image.

Aspects of the present disclosure are directed to systems and methods to train models to encode messages into images. At least one server can identify a training dataset including: (i) a first image having a first plurality of pixels in a color space having a set of channels, (ii) a data matrix corresponding to a message to be encoded, and (iii) a second image having a second plurality of pixels in the color space corresponding to the first image encoded with the data matrix. The at least one server can apply a machine learning (ML) model comprising a plurality of convolutional layers to the first image and to the data matrix to generate a third image having a third plurality of pixels in the color space. The third image can correspond to the first image encoded with the data matrix across the set of channels in the color space. The at least one server can compare the third image generated from applying the ML model with the second image from the training dataset. The at least one server can update at least one of the plurality of convolutional layers in the ML model in accordance with the comparison.

Aspects of the present disclosure are directed to systems and methods to train models to decode messages from images. At least one server can identify a second training dataset including: (i) a fourth image having a fourth plurality of pixels in a color space having a set of channels across which a second data matrix is encoded, and (ii) the second data matrix to be recovered from the fourth image. The at least one server can apply a second ML model comprising a second plurality of convolutional layers to the fourth image to identify a third data matrix decoded from the fourth plurality of pixels of the color space. The at least one server can compare the third data matrix identified from the second ML model and the second data matrix of the second training dataset. The at least one server can update at least one of the second plurality of convolutional layers in the second ML model in accordance with the comparison between third data matrix and the second data matrix.

DETAILED DESCRIPTION

Figure 1:
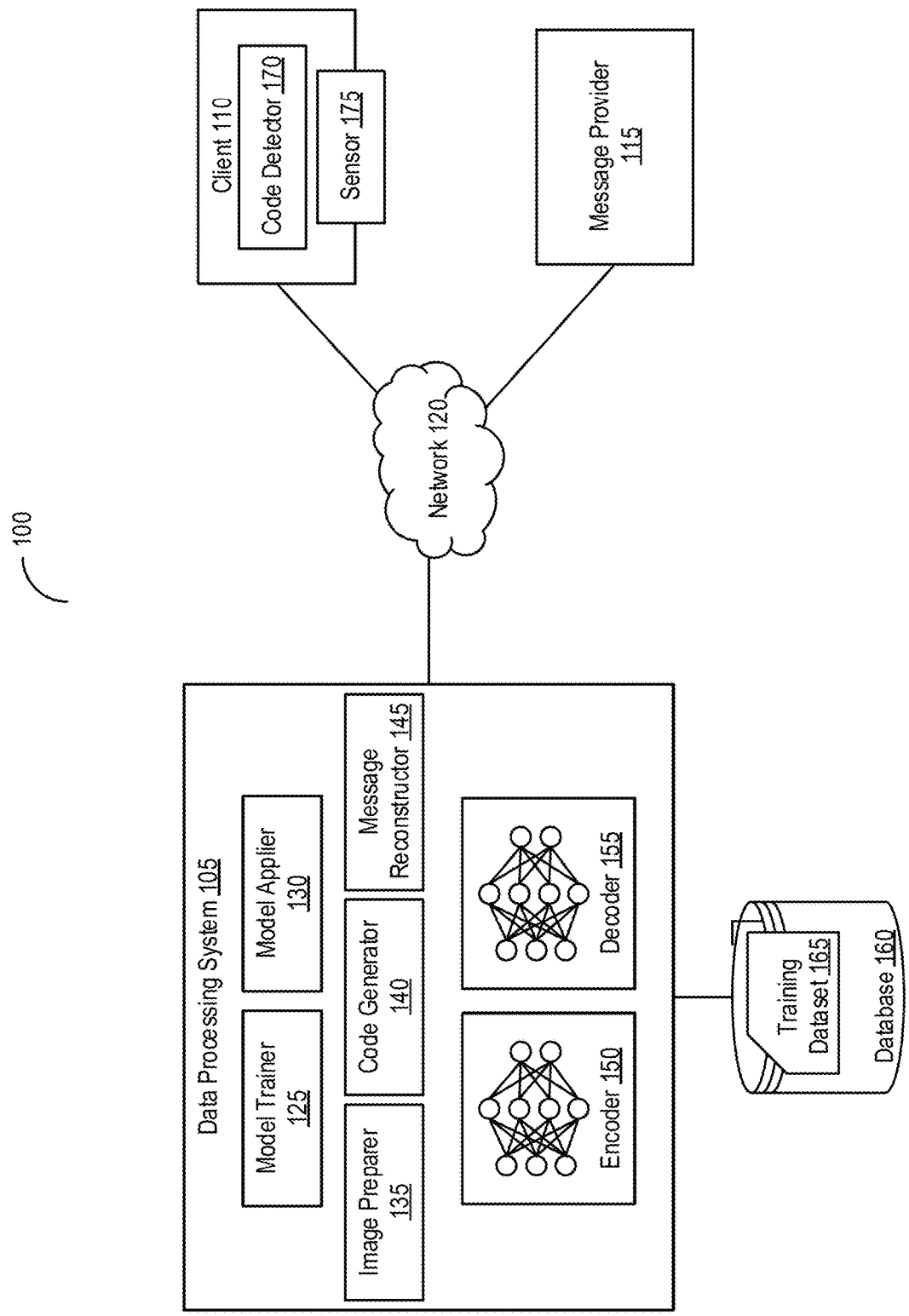
FIG. 1 depicts a block diagram of a system for encoding and decoding messages associated with images in accordance with an illustrative embodiment.

Following below are more detailed descriptions of various concepts related to, and implementations of, methods, apparatuses, and systems of encoding messages into images and decoding messages from images using machine learning (ML) models. The various concepts introduced above and discussed in greater detail below may be implemented in numerous ways.

In accordance with stenographic techniques, a computing system can embed a watermark carrying a secret message in images such that the watermark is imperceptible to human viewers. One problem can be that if the quality of the image is even slightly degraded, the hiding capacity and the performance of the embedded watermark in the image can be extremely negatively affected. For example, poor scanning or cropping of even a minute portion of the image with the watermark can lead to inability to recover the watermark or the message encoded therein. Certain approaches of steganography can be used to maintain the statistical properties of the images, but the visual quality of the embedded images can decrease, sometimes resulting in the watermark becoming perceptible to human viewers. Furthermore, these approaches may not be able to support encoding watermarks in a pure tone or near-pure tone image, as the embedded watermark can introduce artifacts (e.g., graininess) into the resultant image.

To address these and other technical challenges, a data processing system can embed a data matrix code from the secret message into a color channel of a cover image using a neural network-based encoder-decoder model to achieve high visual quality and security. The data matrix code itself can be a binary message of any length arranged in a matrix constructed from the secret message with an error correction code. For instance, the data matrix can be a 100-bit long message with 72 bits corresponding to the secret message specified by a user and the remaining bits used as error correction code. The embedding of the data matrix code can be repeated throughout various segments forming the cover image to increase the likelihood of recovery when the quality of cover image is degraded or the acquired image is cropped.

In the system, the encoder model (e.g., a U-NET or auto-encoder) can be used to encode a data matrix constructed from a secret message into a cover image. The encoder can take the cover image (e.g., in the form of a bitmap, a Joint Photographic Experts Group (JPEG) format, Portable Network Graphics (PNG), or a tag image file format (TIFF)) along with the data matrix containing a secret message as an input. The encoder can concatenate or combine the image and the data matrix to generate a cover image with the data matrix embedded into a color channel (e.g., red-green-blue (RGB) channel) of the original image. In processing, the encoder can convert the data matrix to output a 50×50×3 tensor, and then up-sample to produce a 400×400×3 tensor, with the same dimensions as the input image (e.g., 400×400) with the corresponding color channel (e.g., 3 for RGB). The encoder can be trained using training data containing an input image, a data matrix, and a cover image embedded with the data matrix to minimize perceptual differences between the input and encoded cover images.

With the generation, the data processing system can provide the cover image to be scanned or acquired via a camera on a client device. Upon acquisition of the cover image, a detector running on the client device can apply a detection logic to determine whether the cover image is encoded with the data matrix (or contains a watermark). The image acquired by the client device can constitute a portion of the image (e.g., at least 400×400 pixel portion). The detection logic can be light-weight, using less computational power than the neural network-based encoder and decoder model used by the data processing system. If the acquired image is determined to be encoded, the client device can pass the image onto the data processing system for decoding of the message from the image.

Upon receipt, the decoder model (e.g., a fully convolutional neural network) can be used to decode the data matrix from the cover image. In processing, the decoder can recover the data tensor (e.g., 50×50×3 tensor) corresponding to the data matrix. With the recovery, the data processing system can decrypt the data matrix to reconstruct the secret message originally embedded in the cover image. The message can be provided back to the client device or can be used to perform various actions in accordance with the message on the data processing system. The decoder can be trained using training data containing a cover image with various corruptions (e.g., from printing, reimaging, cropping, image wearing, and noise) and a data matrix embedding in the cover image to make the recovery robust from such corruptions.

In this manner, the computing system can generate and provide cover images of higher quality and security with the embedded data matrix to carry the secret message. Because the data matrix is embedded across the color channel of the cover image, the data matrix can be embedded and successfully decoded even in pure tone or near-pure tone images (e.g., images without much variation in color). Even with the corruptions of the cover image (e.g., due to cropping, poor acquisition, and degradation of the physical print), the system can recover the data matrix from the acquired cover image, with higher probability of success. With higher probability of successful recovery, the computing system can also, by extension, reconstruct the secret message with higher probabilities of success.

FIG. 1 depicts a block diagram of a system 100 for encoding and decoding messages associated with images. In overview, the system 100 can include at least one data processing system 105, at least one client 110, and at least one message provider 115, communicatively coupled with one another via at least one network 120. The data processing system 105 can include at least one model trainer 125, at least one model applier 130, at least one image preparer 135, at least one code generator 140, at least one message reconstructor 145, at least one encoder 150, at least one decoder 155, and at least one database 160. The database 160 can store, maintain, or otherwise include at least one training dataset 165. The client 110 can include at least one code detector 170 and at least one sensor 175.

Figure 14:
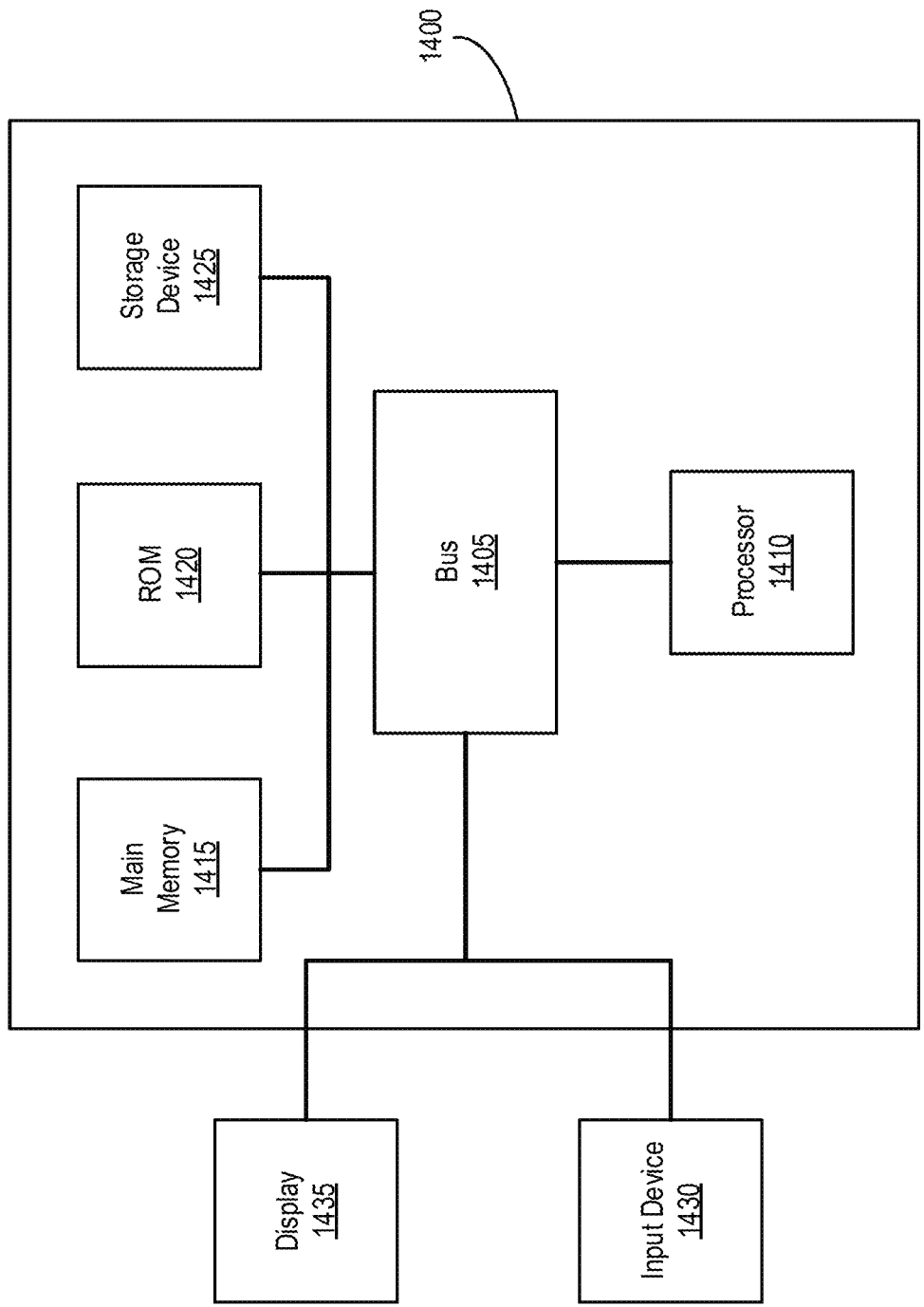
FIG. 14 depicts a block diagram illustrating an architecture for a computer system that can be employed to implement elements of the systems and methods described and illustrated herein.

Each of the components or modules of the system 100 (such as the data processing system 105, including the model trainer 125, the model applier 130, the image preparer 135, the code generator 140, the message reconstructor 145, the encoder 150, and the decoder 155, the client 110, and the message provider 115) can be implemented using hardware or a combination of software and hardware such as those detailed herein in conjunction with FIG. 14. Each component can include logical circuitry (e.g., a central processing unit) that responds to and processes instructions fetched from a memory unit. Each electronic component can be based on any of these processors, or any other processor capable of operating as described herein. The central processing unit can utilize any or multiple of the following: instruction level parallelism, thread level parallelism, different levels of cache, and multi-core processors. A multi-core processor can include two or more processing units on a single computing component.

The data processing system 105 can include one or more servers or other computing devices to encode messages into images and decode messages from images. The data processing system 105 can include the model trainer 125, the model applier 130, the image preparer 135, the code generator 140, the message reconstructor 145, the encoder 150, and the decoder 155, among others. The data processing system 105 may include the database 160 or may have access to the database 160 (e.g., via the network 120). Each of the model trainer 125, the model applier 130, the image preparer 135, the code generator 140, the message reconstructor 145, the encoder 150, and the decoder 155 can include at least one processing unit, server, virtual server, circuit, engine, agent, appliance, or other logic device such as programmable logic arrays to perform the computer-readable instructions.

The client 110 can include an end-user computing device (e.g., a tablet, smartphone, laptop, desktop, or smart television) associated with a user to pass images acquired for additional processing by the data processing system 105. The code detector 170 can be a standalone application, a plugin, or other process or thread executable on the client 110 to perform initial processing of the image acquired via the sensor 175. For example, the code detector 170 can be a separate application opened to process images captured via the sensor 175 or can be a plugin part of another application for controlling acquisition of the images via the sensor 175. The code detector 170 can be provided by the data processing system 105 or an associated entity for installation on the client 110. The sensor 175 can be, for example, a camera (e.g., a charge-coupled device (CCD), active-pixel sensor (APS) including complementary metal-oxide-semiconductor (CMOS) sensor, or digital single-lens reflex camera (DSLR)) or an image scanner (e.g., CCD, contact image sensor (CIS), or film scanner) to obtain or acquire at least one image situated generally in front of the sensor 175. The sensor 175 can be an integral part of the client 110 or can be communicatively coupled with the client 110.

The message provider 115 can include one or more servers or other computing devices associated with a publisher or another end-user to provide at least one message to the data processing system 105 to be encoded into an image. The message can include any form of data to be encoded or embedded into the image to be acquired by the client 110 via the sensor 175. The message can, for example, include a resource identifier (e.g., a Uniform Resource Locator (URL)) corresponding to at least one information resource (e.g., a webpage) to be accessed by the client 110. The information resource can be associated with a publisher providing the message to the data processing system 105.

The data processing system 105, along with its components such as the model trainer 125, the model applier 130, the encoder 150, and the decoder 155, can have a training mode and an runtime mode (sometimes herein referred to as an evaluation or inference mode). Under the training mode, the data processing system 105 can use labeled examples from the training dataset 165 to train the encoder 150 and the decoder 155 to update the weights therein. Under the runtime mode, the data processing system 105 can use newly acquired messages to encode into images using the encoder 150. The data processing system 105 can also use newly acquired cover images from which to decode messages using the decoder 155. Details of the training mode and runtime mode are provided below in conjunction with FIGS. 2-10.

Figure 2:
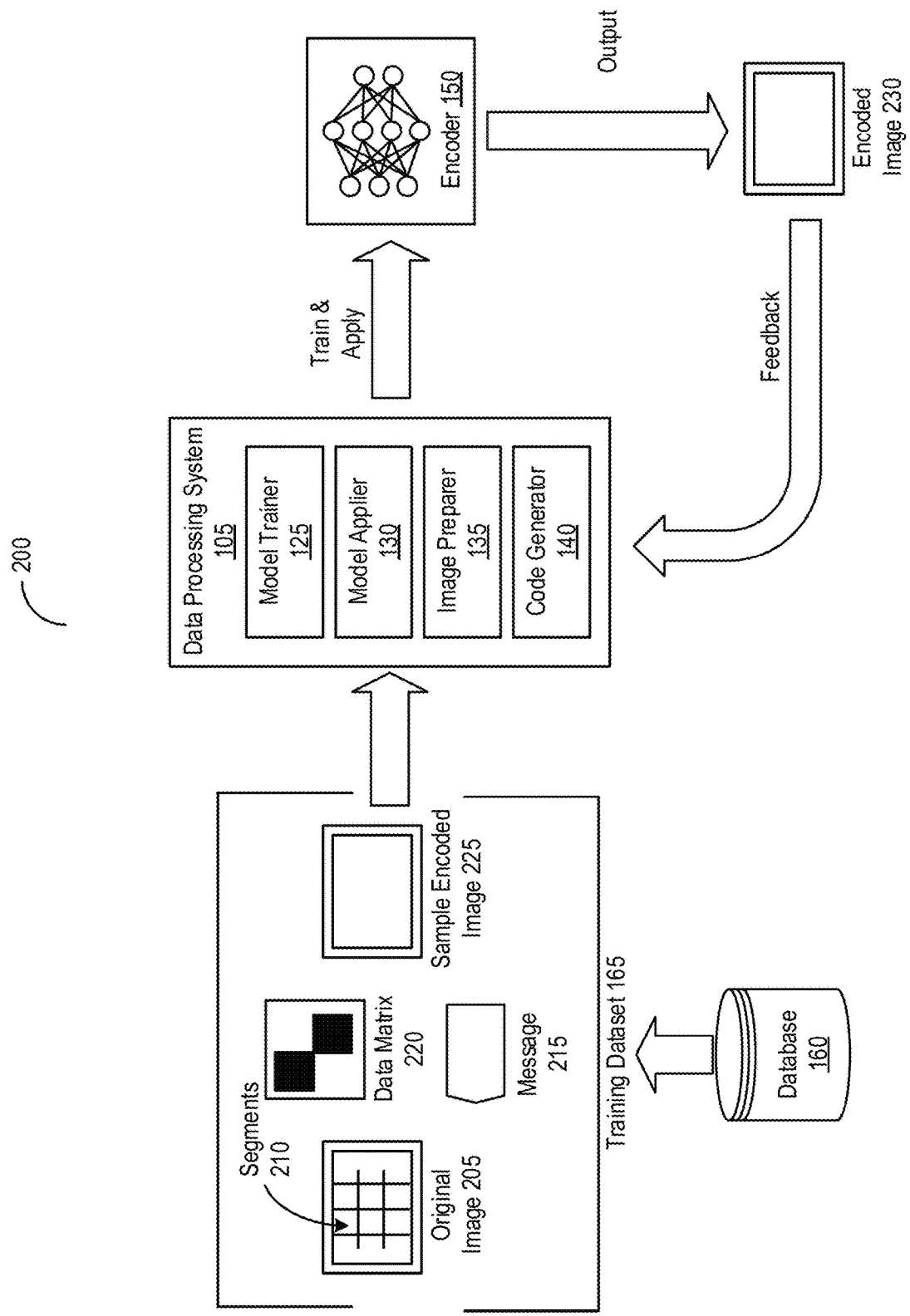
FIG. 2 depicts a block diagram of a process to train an encoder in the system for encoding messages into images in accordance with an illustrative embodiment.

FIG. 2, among others, depicts a block diagram of a process 200 to train an encoder in the system 100 for encoding messages into images. The process 200 can correspond to or include operations performed in the system 100 to train encoder models to encode messages into images. Under the process 200, the model trainer 125 executing on the data processing system 105 can access the database 160 to retrieve, receive, or otherwise identify the training dataset 165 for training the encoder 150. The training dataset 165 can identify or include a set of examples for training the encoder 150. Each example can be maintained and stored on the database 160 using one or more data structures, such as arrays, matrices, tables, linked lists, trees, and heaps, among others.

Each example of the training dataset 165 can identify or include at least one original image 205. The original image 205 can correspond to at least one image file in any format, such as a bitmap (BMP), a Joint Photographic Experts Group (JPEG) format, a Graphics Interchange Format (GIF), Portable Network Graphics (PNG) format, Scalable Vector Graphics (SVG) format, or a Tag Image File Format (TIFF), among others. The original image 205 can correspond to at least one frame in a video in any format, such as a Moving Picture Experts Group (MPEG), a QuickTime Movie (MOV), Windows Media Viewer (WMV), or Audio Video Interleave (AVI), among others. The file for the original image 205 can be stored and maintained on the database 160 as part of the training dataset 165.

The original image 205 can have a set of pixels in two-dimensions (e.g., having x by y pixels) or three-dimensions (e.g., having x by y by z pixels). The original image 205 can be divided or partitioned into a set of image segments 210. Each image segment 210 can correspond to a portion of the set of pixels of the original image 205. For example, each segment 210 can correspond to a 400×400 pixels portion of the original image 205. The training dataset 165 can include or identify a definition of the image segments 210 in the original image 205. Adjacent image segments 210 of the set can be non-overlapping or overlapping in accordance with a set ratio (e.g., 10-90% overlap).

Each pixel in the set of pixels in the original image 205 can have a value identified or defined in a color space (sometimes herein referred to as a color model). The color space can define a set of color values (or chromaticity) in accordance with a mapping. The color space can include, for example, a red-green-blue (RGB) color space, a cyan-magenta-yellow-key (CMYV) color space, a hue-saturation-lightness (HSL) color space, or a hue-saturation-brightness (HSB) color space, among others. The color space can be comprised of a set of channels. Each channel can correspond to a respective color value in the set. The arrangement of color values in the color space can form an n-tuple for the set. For example, if an RGB color space is used for the pixels of the original image 205, the set of color values can include a red value, a green value, and a blue value. In this example, one channel can correspond to the red value, another channel can correspond to the green value, and another channel can correspond to the blue value.

In the training dataset 165, each example can also identify or include at least one message 215. The message 215 can correspond to or include any data in the form of text, another image, audio, or other files to be encoded into the original image 205. The message 215 can include a resource identifier (e.g., a Uniform Resource Locator (URL)) corresponding to an information resource (e.g., a webpage). The resource identifier of the message 215 can be provided by or associated with at least one of the message providers 115. Each example can also identify or include at least one data matrix 220 associated with the message 215. The data matrix 220 can identify or correspond to a word (e.g., a binary string of any length) based on the message 215 and an error correction code derived from at least a portion of them message 215. The data matrix 220, for example, can be a 100-bit long binary message, with 72 bits corresponding to the message 215 and the remaining bits corresponding to the error correction code. The error correction code used for the data matrix 220 can include, for example, a block code (e.g., Reed-Solomon coding, Golay code, Bose-Chaudhuri-Hocquenghem (BCH) code, Multidimensional parity, or Hamming code) or a convolutional code (e.g., trellis-based coding, Turbo codes, punctured code), among others. While discussed in terms of a data matrix 220, other representations can be used for the message 215 to encode into the original image 205, such as an Aztec code, a data glyph, any barcode symbology (e.g., Code 39, 98, 128, or PDF417), or a quick response (QR) code, among others.

Each example of the training dataset 165 can identify or include at least one sample encoded image 225 (sometimes herein referred to as a sample cover image). The sample encoded image 225 can correspond to the original sample image 205 encoded with the data matrix 220 corresponding to the message 215. The sample encoded image 225 can be of the same file format as the original image 205. The sample encoded image 225 can be generated using other steganophaphic techniques independent of the encoder 150, such as a least significant bit, a fast Fourier transform, redundant pattern encoding, and encrypt and scatter techniques, among others. The sample encoded image 225 can have a set of pixels in two-dimensions (e.g., having x by y pixels) or three-dimensions (e.g., having x by y by z pixels) of the same size as the original sample image 205. The sample encoded image 225 can be formed using the set of image segments 210, each image segment 210 encoded with the data matrix 220. Each pixel in the set of pixels in the sample encoded image 225 can have a value identified or defined in the same color space as the original image 205. By extension, the set of channels for the pixels of the sample encoded image 225 can be defined in the same color space as the set of channels for the pixels of the original image 205. For instance, if an RGB color space is used for the pixels of the original image 205, the sample encoded image 225 can also be in the RGB color space, and can have set of channels corresponding to red, green, and blue values respectively.

The sample encoded image 225 can differ from the original image 205 from which the sample encoded image 225 is derived. The data matrix 220 can be encoded or embedded in at least a portion of the set of pixels of the sample encoded image 225. The portion of the set of pixels corresponding to the data matrix 220 in the sample encoded image 225 can differ from the set of pixels of the original image 205 in terms of color value. The amount of deviation between the pixels of the sample encoded image 225 and the pixels of the original image 205 can correspond to a different in pixel values between the two images. The amount of deviation between the two images can satisfy (e.g., be less than or equal to) a threshold level. The threshold level can correspond to or can be defined using a just noticeable difference (JND) to a human observer, in order to train the encoder 150 to generate an encoded images with the embedded data matrix that is similar to the original image 205. The JND can correspond to an amount of deviation at which the human observer can perceive the difference between the original image 205 and the sample encoded image 225.

In the sample encoded image 225, the data matrix 220 can be encoded across the set of channels in the color space. For instance, if the RGB color space is used, the data matrix 220 can be encoded in the red, green, and blue values (RGB) of the pixels of the sample encoded image 225. As a result, at least a portion of the set of channels of the color space in the set of pixels of the sample encoded image 225 can differ from the set of channels of the color space in the set of pixels of the original image 205. For example, the data matrix 220 can be encoded or embedded in across the set of channels in the color space of the sample encoded image 225. The amount of deviation in the set of channels of the sample encoded image 225 from the set of channels in the color space of the original image 205 can satisfy (e.g., be less than or equal to) the threshold level (e.g., below the JND to a human observer).

In preparation of training the encoder 150, the image preparer 135 executing on the data processing system 105 can produce, output, or otherwise generate the set of image segments 210 from the original image 205. From each example of the training dataset 165, the image preparer 135 can identify the original image 205 from which to form the image segments 210. As discussed above, each image segment 210 can correspond to a portion of the set of pixels of the original image 205. The image preparer 135 can partition or divide the original image 205 to form the image segments 210. Each image segment 210 can be defined to fit an input size of the encoder 150. The input size can be of any dimensions, for instance, 100×100, 200×200, 400×400, or 800×1600 pixels, among others. The set of image segments 210 can be non-overlapping or overlapping in accordance with a set ratio (e.g., 10-90% overlap) between adjacent pairs of the image segments 210. The image preparer 135 can retrieve or identify the set of image segments 210 from the original image 205 as defined by the training dataset 165.

The image preparer 135 can include, introduce, or otherwise add perturbations to the original image 205 (or individual image segments 210). The perturbations can be used to simulate or approximate noise, filtering, smudging, blending, interference, obfuscation, and other non-ideal conditions in presentation of such images, such as the original image 205 or individual image segments 210. The perturbations can also be to train the encoder 150 to be robust from such conditions when processing newly acquired images. With the identification of the original image 205, the image preparer 135 can identify or select a type of perturbation to add. Upon selection, the image preparer 135 can produce, create, or otherwise generate the perturbation, and can add the perturbation to the original image 205.

The code generator 140 executing on the data processing system 105 can produce, output, or otherwise generate the data matrix 220 using the message 215. The code generator 140 can retrieve or identify the message 215 from each example of the training dataset 165. The code generator 140 can also select the message 215 (e.g., at random), from the training dataset 165, with which to encode into the original image 205. With the identification, the code generator 140 can transform or convert the message 215 into a word (e.g., a binary string). The code generator 140 can select or identify at least a portion of the message 215 (in original form or binary string) to use for error correction. Using at least the identified portion of the message 215, the code generator 140 can determine, output, or otherwise generate an error correction code in accordance with an error correction code algorithm. The error correction code algorithm can include, for example, a block code (e.g., Reed-Solomon coding, Golay code, Bose-Chaudhuri-Hocquenghem (BCH) code, Multidimensional parity, or Hamming code) or a convolutional code (e.g., trellis-based coding, Turbo codes, punctured code), among others. The error correction code can also be another word (e.g., a binary string). The code generator 140 can add or combine the error correction code with the word corresponding to the message 215 in accordance with the error correction code algorithm to output, form, or otherwise generate the data matrix 220.

In conjunction, the model trainer 125 can initialize and establish the encoder 150. The encoder 150 can have at least one input, at least one output, and a set of weights (sometimes herein referred to as parameters, kernels, or filters) associating the input with the output. The set of weights can be arranged or defined in accordance with an artificial neural network (ANN) based machine learning (ML) model, such as a convolutional neural network (CNN) (e.g., U-Net, an auto-encoder, a residual neural network (ResNet), or a recurrent neural network (RNN)), among others. For instance, the encoder 150 can include a set of weights arranged as a set of convolutional layers and a set of de-convolutional layers. When initialized, the model trainer 125 can assign the values of the set of weights to initial values. For instance, the model trainer 125 can assign random values to the set of weights in the encoder 150. Details of the architecture and functionality of the encoder 150 are described herein below in conjunction with FIGS. 3 and 4.

The model applier 130 executing on the data processing system 105 can apply the original image 205 and the data matrix 220 from each example of the training dataset 165 to the encoder 150. The model applier 130 can apply each image segment 210 of the image 205 along with the data matrix 220 to the encoder 150. To apply, the model applier 130 can aggregate, join, or otherwise combine the original image 205 (or each image segment 210) and the data matrix 220 to output, produce, or otherwise generate at least one input to feed to the encoder 150. Upon feeding, the model applier 130 can process the input in accordance with the set of weights of the encoder 150 to produce or generate at least one encoded image 230. The encoded image 230 can be generated by the encoder 150 to be similar to the sample encoded image 225. The model applier 130 can also gather, combine, or aggregate outputs from applying each image segment 210 to form or generate the encoded image 230. The outputs correspond to a respective input image segment 210, and the encoded image 230 can be formed by the model applier 130 using the combination of the image segments 210. Throughout the duration of training, the encoded images 230 outputted by the encoder 150 can become more and more similar to the sample encoded image 225 in successive training epochs.

The encoded image 230 can correspond to the original sample image 205 encoded with the data matrix 220 corresponding to the message 215. The encoded image 230 can have a set of pixels in two-dimensions (e.g., having x by y pixels) or three-dimensions (e.g., having x by y by z pixels) of the same size as the original sample image 205. The encoded image 230 can be formed using the set of image segments 210, each image segment 210 encoded with the data matrix 220. Each pixel in the set of pixels in the encoded image 230 can have a value identified or defined in the same color space as the original image 205. By extension, the set of channels for the pixels of the encoded image 230 can be defined in the same color space as the set of channels for the pixels of the original image 205. For instance, if an RGB color space is used for the pixels of the original image 205, the encoded image 230 can also be in the RGB color space, and can have set of channels corresponding to red, green, and blue values respectively. The data matrix 220 can be encoded or embedded in at least a portion of the set of pixels of the encoded image 230. The portion of the set of pixels corresponding to the data matrix 220 in the encoded image 230 can differ from the set of pixels of the original image 205 in terms of color value. The data matrix 220 can be encoded across the set of channels in the color space in the encoded image 230.

Figure 3:
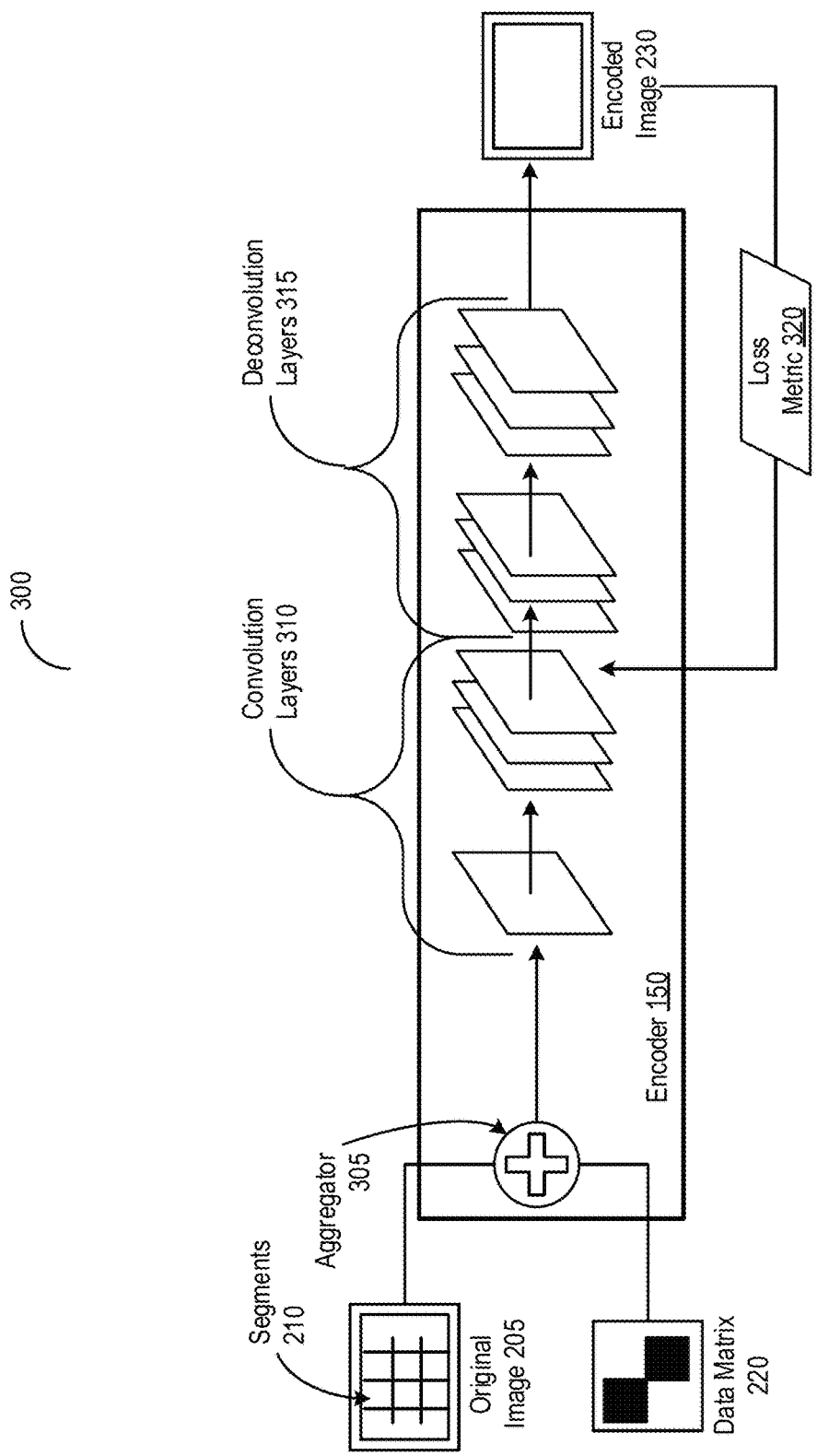
FIG. 3 depicts a block diagram of a process to determine loss metrics for training the encoder in the system for encoding messages into images in accordance with an illustrative embodiment.

FIG. 3 depicts a block diagram of a process 300 to determine loss metrics for training the encoder 150 in the system 100 for encoding messages into images. The process 300 can include or correspond to operations in the system 100 in determining loss metrics used to update the weights in the encoder 150. The process 300 can be a part of the process 200 to train the encoder 150. Under the process 300, the encoder 150 can include at least one aggregator 305 to receive the original image 205 (or each image segment 210) and the data matrix 220 fed by the model applier 130. The aggregator 305 can join, concatenate, or otherwise combine the original image 205 (or each image segment 210) and the data matrix 220 to output a data tensor to feed forward in the encoder 150. The data tensor can have a size corresponding to the combination of the size of the original image 205 and the size of the data matrix 220. For example, the original image 205 (or each individual image segment 210) can have a size of m×n pixels and the data matrix 220 can have k bits. The resultant from the combination can be a data tensor with a size of m×n×k points. Upon combination of the original image 205 and the data matrix 220, the aggregator 305 can feed forward the generated data tensor to be processed by the set of weights.

The encoder 150 can include a set of convolutional layers 310 to process the data tensor from the aggregator 305. The set of convolutional layers 310 can define at least a portion of the set of weights in the encoder 150. The portion of the weights corresponding to the convolutional layers 310 can be defined according to an architecture of the machine learning (ML) model used to implement the encoder 150, such as the CNN, U-net, ResNet, or RNN, among others. The encoder 150 can process the data tensor from the aggregator 305 in accordance with weights corresponding to the set of convolutional layers 310 to generate at least one feature map. The feature map can correspond to a lower-dimensional representation of the input (e.g., the combination of the original image 205 and the data matrix 220). For instance, the feature map can be embedding, encoding, or a representation of latent features in the data tensor. Upon generation, the set of convolutional layers 310 can feed the feature map forward to the remainder of the weights in the encoder 150.

The encoder 150 can include a set of de-convolutional layers 315 to process the feature map outputted by the set of convolutional layers 310. The set of de-convolutional layers 315 can define a remaining portion of the set of weights in the encoder 150. The portion of the weights corresponding to the de-convolutional layers 315 can be defined in accordance with a remainder of the architecture of the ML model formed with the set of convolutional layers 310. The encoder 150 can process the feature map from the set of convolutional layers 310 in accordance with weights corresponding to the set of de-convolutional layers 315 to generate an output to define the encoded image 230. The output can be a data tensor with a size of m×n×l points. The m×n data points of the data tensor can correspond to the pixel size of the encoded image 230, which is the same as the size of the original image 205. The l points of the data tensor can correspond to the set of channels for the color space of the pixels of the encoded image 230. For instance, the l points can correspond to the red, green, and blue color channels for the RGB color space for the pixels of the encoded image 230. With the generation, the encoder 150 can output the encoded image 230.

The set of the convolutional layers 310 and the de-convolutional layers 315 can define or form the set of weights for the encoder 150. The set of the convolutional layers 310 and the de-convolutional layers 315 can also include or define interconnections among the portion of the set of weights, such as using down-samplers, skip connectors, or up-samplers, arranged in accordance with the architecture. The down-sampler can reduce a dimension reduction to the input using a pooling operation (e.g., a max-pooling, an average-pooling, or a min-pooling) or down-sampling operation (e.g., low-pass filter and decimation). The skip-connector can feed the output from layer to skip one or more succeeding layers to the following layer. The up-sampler can perform a dimension expansion of the input, using an up-sampling operation (e.g., via zero-packing and interpolation). Each of the convolutional layers 310 and the de-convolutional layers 315 can be arranged in series with one another, with an output of one layer fed forward as the input as the succeeding layer. The last of the de-convolutional layers 315 can form an integrator to combine the feature maps from previous convolutional layers 310 and de-convolutional layers 315 of the encoder 150. Each layer can have a non-linear, input-to-output characteristic. Each of the convolutional layers 310 and the de-convolutional layers 315 can include a convolutional layer, a normalization layer, and an activation layer (e.g., a rectified linear unit (ReLU), softmax function, or a sigmoid function), among others.

With the generation, the model trainer 125 can compare the encoded image 230 against the corresponding sample encoded image 225 to calculate, generate, or otherwise determine at least one loss metric 320. The model trainer 125 can retrieve or identify the sample encoded image 225 with which to compare based on the input original image 205 from the same example in the training dataset 165. The loss metric 320 can indicate or identify a degree of deviation of the encoded image 230 outputted by the encoder 150 and the expected, sample encoded image 225 (e.g., on a pixel-by-pixel color value basis). The degree of deviation can, for example, correspond to a discrepancy in pixel-by-pixel color values between the encoded image 230 and the sample encoded image 225. The model trainer 125 can calculate the loss metric 320 in accordance with any number of loss functions, such as a norm loss (e.g., L1 or L2), mean squared error (MSE), a quadratic loss, a cross-entropy loss, Wasserstein loss, and a Huber loss, among others. In general, the higher the degree in deviation of the encoded image 230 from the sample encoded image 225, the higher the loss metric 320 can be. Conversely, the lower the degree in deviation, the lower the loss metric 320 can be.

Using the loss metric 320, the model trainer 125 can modify, set, or otherwise update the set of weights in the encoder 150, such as the weights in the set of convolutional layers 310 and the set of de-convolutional layers 315. The updating of weights can be in accordance with an optimization function (or an objective function) for the encoder 150. The optimization function can define one or more rates or parameters at which the weights of the encoder 150, including the set of convolutional layers 310 and the de-convolutional layers 315 are to be updated. The updating of the parameters in can be repeated until a convergence condition, using the examples of the training dataset 165. For example, the model trainer 125 can determine whether the training of the encoder 150 is completed based on an amount of change in the weights from one training epoch from a prior training epoch. With the establishment of the encoder 150, the model applier 130 can use the encoder 150 to encode data matrices corresponding to secret messages into images during runtime mode.

Figure 4:
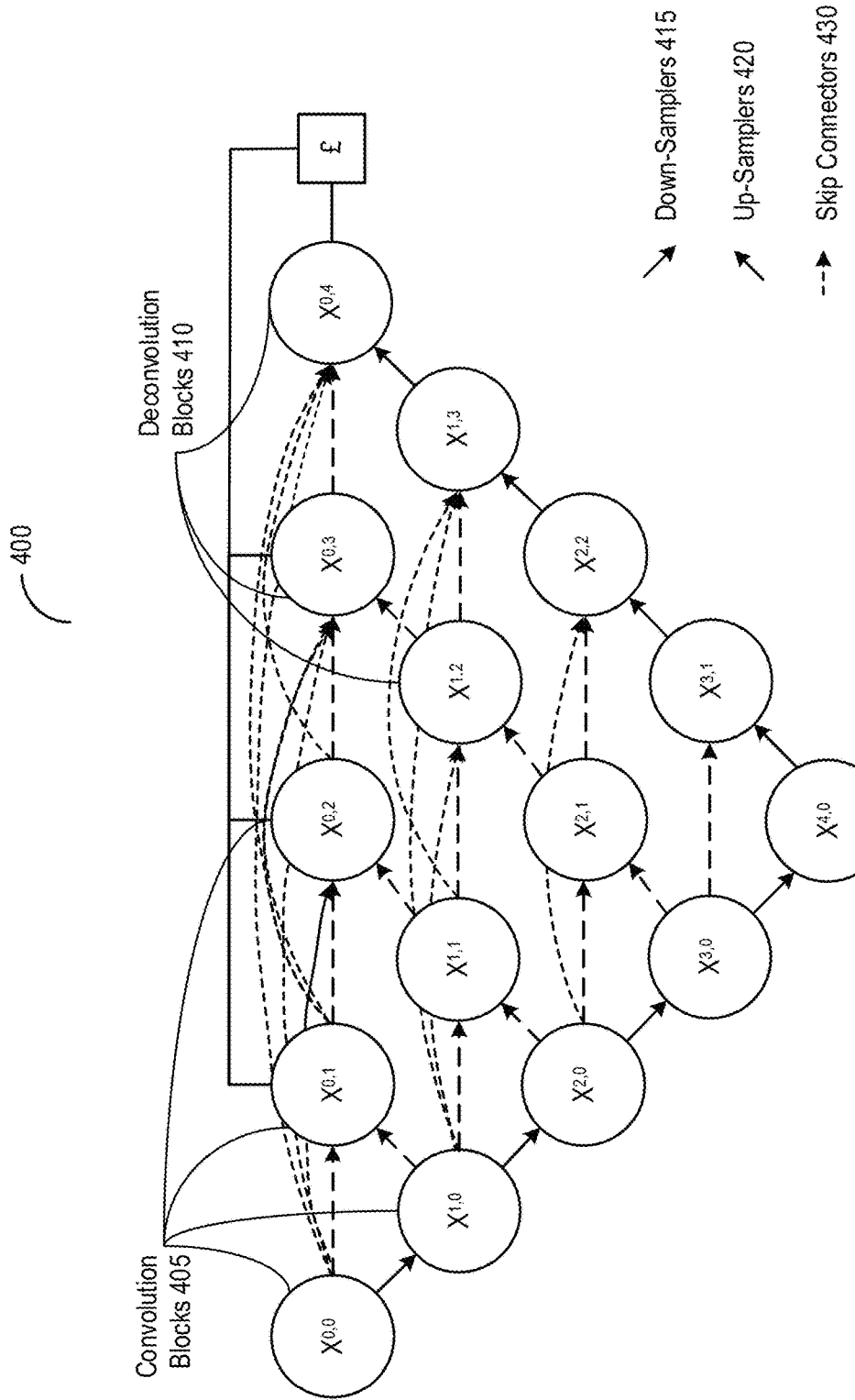
FIG. 4 depicts a block diagram of an architecture for the encoder in the system for encoding messages into images in accordance with an illustrative embodiment.

FIG. 4 depicts a block diagram of an architecture 400 for the encoder 150 in the system for encoding messages into images. The architecture 400 can be used to implement the encoder 150, and can be a form of a U-Net network (sometimes referred herein as a U-Net++ network architecture). Under the architecture 400, the encoder 150 can have a set of convolution blocks 405 (generally depicted in the left half) and a set of deconvolution blocks 410 (generally depicted in the right half). The convolution blocks 405 and the deconvolution blocks 410 can be arranged in four layers (layers 1-4). The convolution blocks 405 and the deconvolution blocks 410 can be connected to one another, using one or more down-samplers 415, up-samplers 420, and skip connectors 430, among others.

By arranging the convolution blocks 405 and the deconvolution blocks 410 in accordance with the architecture 400, the encoder 150 can learn features of different depths and resolutions from the input original image 205 and the data matrix 220. The convolution blocks 405 of the encoder 150 can form a feature extractor to identify latent features from the input, and the different layers allow the encoder 150 to learn the latent features at different dimensions and integrate the features through super position. In this manner, the encoder 150 can also learn features regarding edges in large and small objects depicted within the original image 205 from down-sampling operations via the down-samplers 415 and up-sampling operations via the up-samplers 420 across the different layers of the architecture 400. Given k bits of the data matrix 220 and the original image 205 of the size m×n, the aggregator of the encoder 150 can convert and generate a data sensor of size k×m×n points. The encoder 150 can use the convolution blocks 405 and the deconvolution blocks 410 arranged across a variety of layers to improve the precision in learning shallow and deep features.

Figure 5:
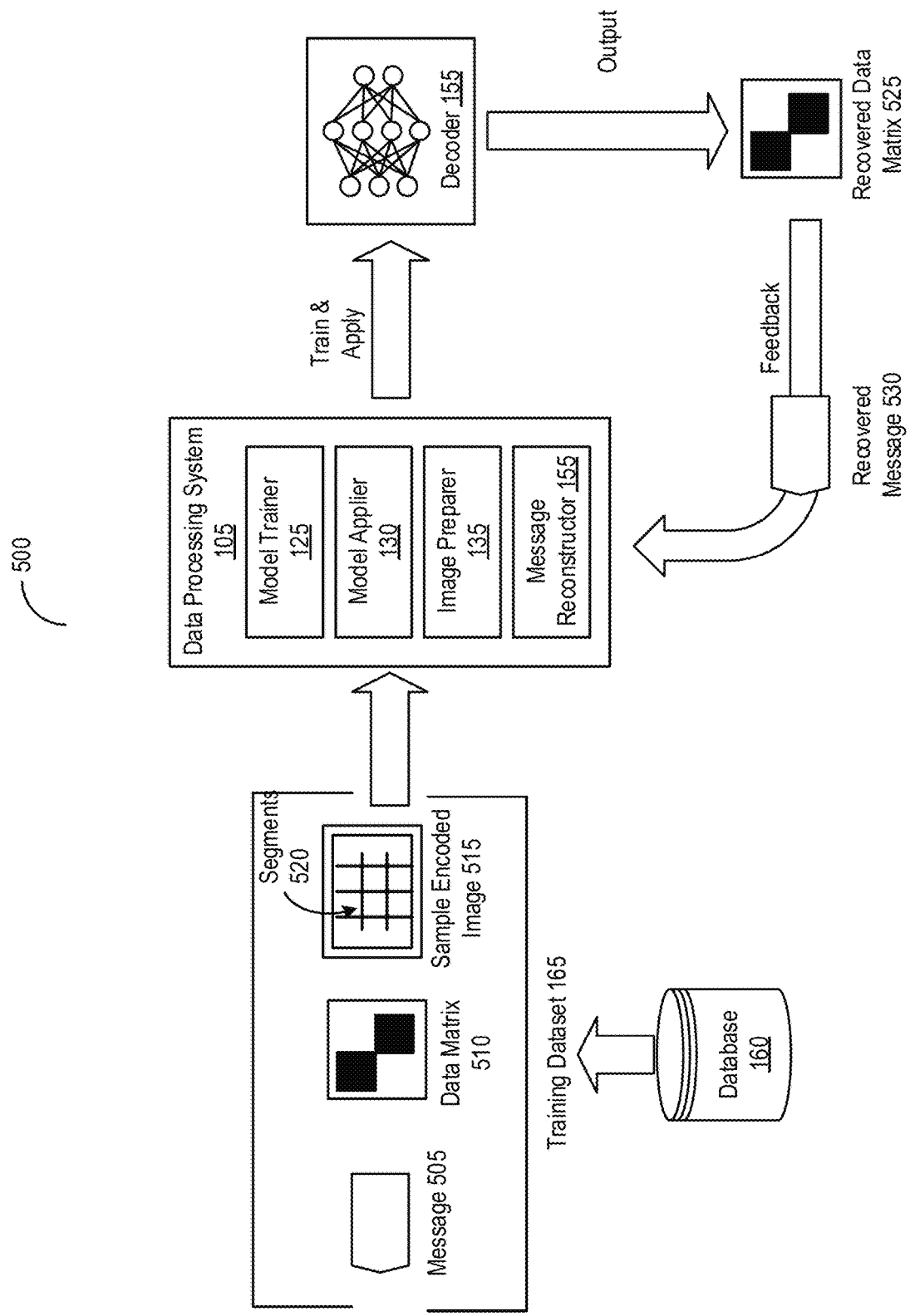
FIG. 5 depicts a block diagram of a process to train a decoder in the system for decoding messages from images in accordance with an illustrative embodiment.

FIG. 5 depicts a block diagram of a process 500 to train a decoder 155 in the system 100 for decoding messages from images. The process 500 can correspond to or include operations performed in the system 100 to train decoder models to decode messages from images. Under the process 500, the model trainer 125 can access the database 160 to retrieve, receive, or otherwise identify the training dataset 165 for training the encoder 150. The training dataset 165 can identify or include a set of examples for training the encoder 150. Each example can be maintained and stored on the database 160 using one or more data structures, such as arrays, matrices, tables, linked lists, trees, and heaps, among others. The training dataset 165 for training the decoder 155 can be the same as or can differ from the training dataset 165 used to train the encoder 150.

Each example of the training dataset 165 can identify or include at least one message 505. The message 505 can be similar to the message 505 detailed herein above. The message 505 can correspond to or include any data in the form of text, another image, audio, or other files to be encoded into the original image 205. The message 505 can include a resource identifier (e.g., a Uniform Resource Locator (URL)) corresponding to an information resource (e.g., a webpage). The resource identifier of the message 505 can be provided by or associated with at least one of the message providers 115.

Each example can also identify or include at least one data matrix 510 associated with the message 505. The data matrix 510 can be similar to the data matrix 220 detailed herein above. The data matrix 510 can identify or include a word (e.g., a binary string of any length) based on the message 505 and an error correction code derived from at least a portion of them message 505. The data matrix 510, for example, can be a 100-bit long binary message, with 72 bits corresponding to the message 505 and the remaining bits corresponding to the error correction code. The error correction code used for the data matrix 510 can include, for example, a block code (e.g., Reed-Solomon coding, Golay code, Bose-Chaudhuri-Hocquenghem (BCH) code, Multidimensional parity, or Hamming code) or a convolutional code (e.g., trellis-based coding, Turbo codes, punctured code), among others. While discussed in terms of a data matrix 510, other representations can be used for the message 215 to encode into an image, such as an Aztec code, a data glyph, any barcode symbology (e.g., Code 39, 98, 128, or PDF417), or a quick response (QR) code, among others.

Furthermore, each example of the training dataset 165 can identify or include at least one sample encoded image 515 (sometimes herein referred to as a sample cover image). The sample encoded image 515 can be similar to the sample encoded image 225 as detailed herein above. The sample encoded image 515 can correspond to at least one image file in any format, such as a bitmap (BMP), a Joint Photographic Experts Group (JPEG) format, a Graphics Interchange Format (GIF), Portable Network Graphics (PNG) format, Scalable Vector Graphics (SVG) format, or a Tag Image File Format (TIFF), among others. The sample encoded image 515 can correspond to at least one frame in a video in any format, such as a Moving Picture Experts Group (MPEG), a QuickTime Movie (MOV), Windows Media Viewer (WMV), or Audio Video Interleave (AVI), among others. The file for the sample encoded image 515 can be stored and maintained on the database 160 as part of the training dataset 165.

The sample encoded image 515 can have a set of pixels in two-dimensions (e.g., having x by y pixels) or three-dimensions (e.g., having x by y by z pixels). The sample encoded image 515 can be divided or partitioned into a set of image segments 210. Each image segment 520 can correspond to a portion of the set of pixels of the sample encoded image 515. For example, each segment 520 can correspond to a 400×400 pixels portion of the sample encoded image 515. The training dataset 165 can include or identify a definition of the image segments 210 in the sample encoded image 515. Adjacent image segments 210 of the set can be non-overlapping or overlapping in accordance with a set ratio (e.g., 10-90% overlap).

Each pixel in the set of pixels in the sample encoded image 515 can have a value identified or defined in a color space (sometimes herein referred to as a color model). The color space can define a set of color values (or chromaticity) in accordance with a mapping. The color space can include, for example, a red-green-blue (RGB) color space, a cyan-magenta-yellow-key (CMYV) color space, a hue-saturation-lightness (HSL) color space, or a hue-saturation-brightness (HSB) color space, among others. The color space can be comprised of a set of channels. Each channel can correspond to a respective color value in the set. The arrangement of color values in the color space can form an n-tuple for the set. For example, if an RGB color space is used for the pixels of the sample encoded image 515, the set of color values can include a red value, a green value, and a blue value. In this example, one channel can correspond to the red value, another channel can correspond to the green value, and another channel can correspond to the blue value.

The sample encoded image 515 can correspond to an original sample image (e.g., the original image 205 as detailed herein above) encoded with the data matrix 510 corresponding to the message 505. The sample encoded image 515 can be of the same file format as the original image. The sample encoded image 515 can be generated using other steganophaphic techniques independent of the encoder 150, such as a least significant bit, a fast Fourier transform, redundant pattern encoding, and encrypt and scatter techniques, among others. The sample encoded image 515 can have a set of pixels in two-dimensions (e.g., having x by y pixels) or three-dimensions (e.g., having x by y by z pixels) of the same size as the original image. The sample encoded image 515 can be formed using the set of image segments 520. Each image segment 520 can be encoded with the data matrix 510, such that the data matrix 510 is repeated throughout the sample encoded image 515. Each pixel in the set of pixels in the sample encoded image 515 can have a value identified or defined in the same color space as the original image. By extension, the set of channels for the pixels of the sample encoded image 515 can be defined in the same color space as the set of channels for the pixels of the original image. For instance, if a RGB color space is used for the pixels of the original image, the sample encoded image 515 can also be in the RGB color space, and can have set of channels corresponding to red, green, and blue values respectively.

In preparation of training the decoder 155, the image preparer 135 can produce, output, or otherwise generate the set of image segments 520 from the sample encoded image 515. From each example of the training dataset 165, the image preparer 135 can identify the sample encoded image 515 from which to form the image segments 520. As discussed above, each image segment 520 can correspond to a portion of the set of pixels of the sample encoded image 515. The image preparer 135 can partition or divide the sample encoded image 515 to form the image segments 520. Each image segment 520 can be defined to fit an input size of the decoder 155. The input size can be of any dimensions, for instance, 100×100, 200×200, 400×400, or 800×1600 pixels, among others. The set of image segments 520 can be non-overlapping or overlapping in accordance with a set ratio (e.g., 10-90% overlap) between adjacent pairs of the image segments 520. The image preparer 135 can retrieve or identify the set of image segments 520 from the sample encoded image 515 as defined by the training dataset 165.

The image preparer 135 can include, introduce, or otherwise add perturbations to the sample encoded image 515 (or individual image segments 520). The perturbations can be used to simulate or approximate noise, filtering, smudging, blending, obfuscation, and other non-ideal conditions in displaying and acquiring images, such as the sample encoded image 515 or individual image segments 520. The perturbations can also be to train the decoder 155 to be robust from such conditions when processing newly acquired images. With the identification of the sample encoded image 515, the image preparer 135 can identify or select a type of perturbation to add. Upon selection, the image preparer 135 can produce, create, or otherwise generate the perturbation, and can add the perturbation to the sample encoded image 515.

In conjunction, the model trainer 125 can initialize and establish the decoder 155. The decoder 155 can have at least one input, at least one output, and a set of weights (sometimes herein referred to as parameters, kernels, or filters) associating the input with the output. The set of weights can be arranged or defined in accordance with an artificial neural network (ANN) based machine learning (ML) model, such as a convolutional neural network (CNN) (e.g., U-Net, an auto-encoder, a residual neural network (ResNet), or a recurrent neural network (RNN)), among others. For instance, the decoder 155 can include a set of weights arranged as a set of convolutional layers and a set of de-convolutional layers. When initialized, the model trainer 125 can assign the values of the set of weights to initial values. For instance, the model trainer 125 can assign random values to the set of weights in the decoder 155. Details of the architecture and functionality of the decoder 155 are described herein below in conjunction with FIG. 6.

The model applier 130 can apply the sample encoded image 515 from each example of the training dataset 165 to the decoder 155. The model applier 130 can apply each image segment 520 of the image 205 to the decoder 155. Upon feeding, the model applier 130 can process the input in accordance with the set of weights of the decoder 155 to derive, extract, or otherwise identify at least one recovered data matrix 525. The recovered data matrix 525 can be generated by the decoder 155 to be similar to the sample encoded image 225. The outputs correspond to a respective input image segment 520, and the recovered data matrix 525 can be repeated throughout each image segment 520 from the sample encoded image 515. Throughout the duration of training, the recovered data matrix 525 outputted by the decoder 155 can become more and more similar to the sample data matrix 510 from the training dataset 165 in successive training epochs.

The recovered data matrix 525 can correspond to the data matrix 510 for the message 505 encoded into the sample encoded 515 that is attempted to be decoded using the decoder 155. The recovered data matrix 525 can be similar to the data matrix 220 or 510 detailed herein above. The data matrix 525 can identify or include a word (e.g., a binary string of any length) based on the message 505 and the error correction code used to generate the data matrix 510 from at least a portion of the message 505. The data matrix 510, for example, can be a 100-bit long binary message, with 72 bits corresponding to the message 505 and the remaining bits corresponding to the error correction code. The error correction code used for the recovered data matrix 525 can include, for example, a block code or a convolutional code as discussed above.

The message reconstructor 145 executing on the data processing system 105 can produce, output, or otherwise generate at least one recovered message 530 using the recovered data matrix 525. The message reconstructor 145 can retrieve, receive, or otherwise identify the recovered data matrix 525 outputted by the decoder 155. With the identification, the message reconstructor 145 can analyze, evaluate, or otherwise parse the recovered data matrix 525 to extract or identify the word (e.g., the binary string). The word can at least partially correspond to the message 505 used to generate the original, data matrix 510. The word can contain or include one or more portions corresponding to the original message (e.g., the message 505) and one or more portions corresponding to the error correction code (e.g., block code or convolutional code).

In accordance with the error correction algorithm, the message reconstructor 145 can determine whether the word contains any errors (e.g., incorrect parity). In determining, the message reconstructor 145 can select or identify one or more portions of the word corresponding to the error correction code. By comparing the error correction code with the remaining portions corresponding to the original message, the message reconstructor 145 can determine whether the word from the recovered data matrix 525 contains any errors. If there are no errors detected (e.g., correct parity), the message reconstructor 145 can continue processing the word from the recovered data matrix 525. If there are any errors, the message reconstructor 145 can rectify, correct, or otherwise modify one or more portions of the words with the errors in accordance with the error correction code. With corrections (if any), the message reconstructor 145 can select or identify at least a remaining portion of the word as the recovered message 530.

Figure 6:
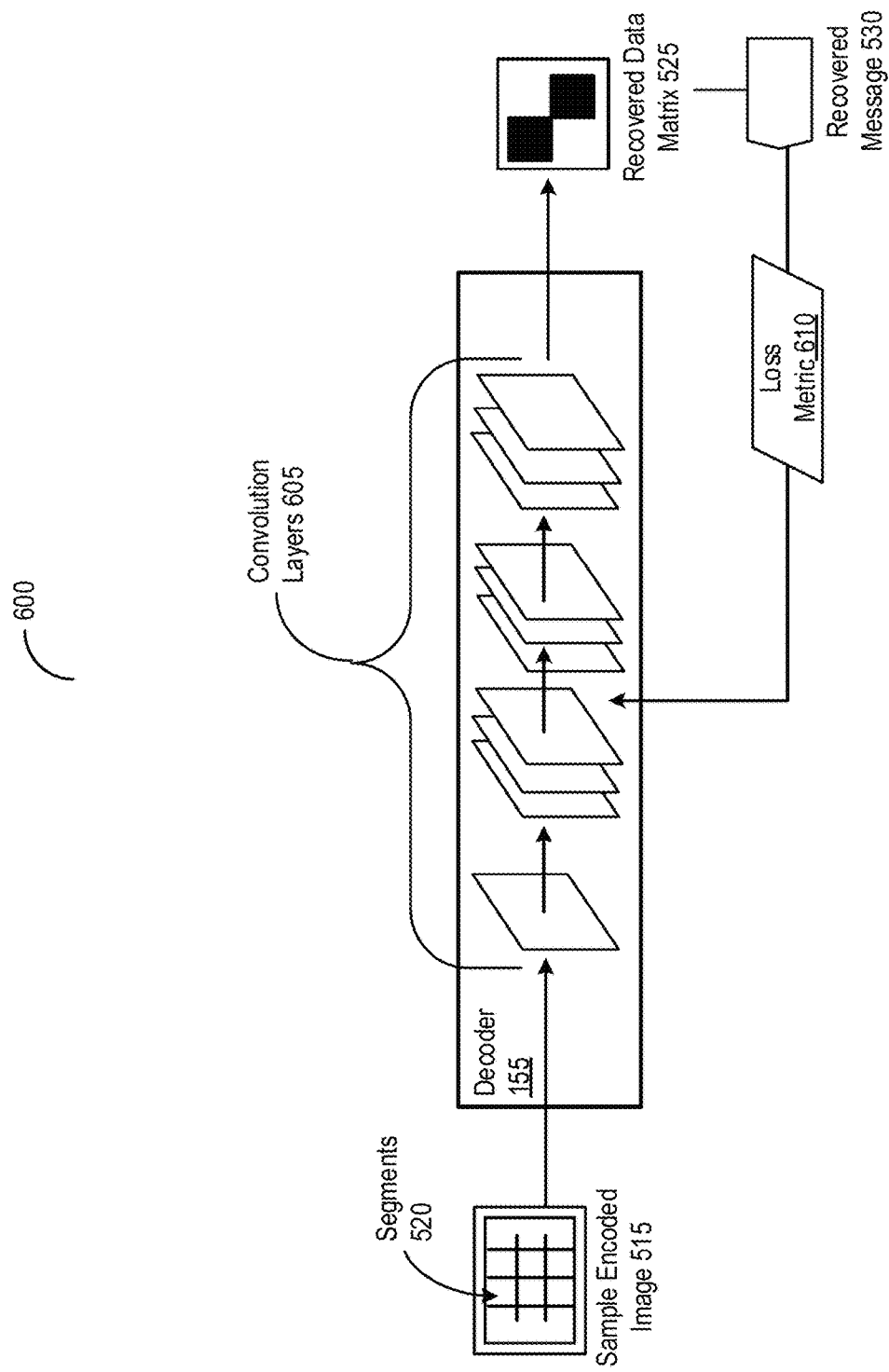
FIG. 6 depicts a block diagram of a process to determine loss metrics for training the decoder in the system for decoding messages from images in accordance with an illustrative embodiment.

FIG. 6 depicts a block diagram of a process 600 to determine loss metrics for training the decoder in the system for decoding messages from images. The process 600 can include or correspond to operations in the system 100 in determining loss metrics used to update the weights in the decoder 155. The process 300 can be a part of the process 500 to train the decoder 155. Under the process 600, the decoder 155 can include a set of convolutional layers 605 to process the input (e.g., the sample encoded image 515 or each individual image segment 520) fed by the model applier 130. The input can correspond to or include a data tensor corresponding to the input sample encoded image 515 (or each individual image segment 520). The data tensor can have a size corresponding to the size of the encoded image 515. For example, the input (e.g., sample encoded image 515) can have a size of m×n×l corresponding to the pixels and the color values across the set of channels in the color space (e.g., RGB values). Likewise, the data tensor can have a size of m×n×l points corresponding to the pixels of the input image, plus the color values across the set of channels in the color space.

The set of convolutional layers 605 can define the set of weights in the decoder 155. The set of the weights corresponding to the convolutional layers 605 can be defined according to an architecture of the machine learning (ML) model used to implement the decoder 155, such as the CNN, U-net, ResNet, or RNN, among others. The decoder 155 can process the input data tensor in accordance with weights corresponding to the set of convolutional layers 605 to generate an output feature map corresponding to the recovered data matrix 525. The feature map can correspond to a lower-dimensional representation of the input (e.g., the sample encoded image 515 or the each individual image segment 210). For instance, the feature map can be embedding, encoding, or a representation of latent features in the data tensor. The output feature map can be a data tensor with a size of k points, representing the word (e.g., binary string) corresponding to the recovered data matrix 525.

The set of the convolutional layers 605 can define or form the set of weights for the decoder 155. The set of the convolutional layers 605 can also include or define interconnections among the portion of the set of weights, such as using down-samplers, skip connectors, or up-samplers, arranged in accordance with the architecture. The down-sampler can reduce a dimension reduction to the input using a pooling operation (e.g., a max-pooling, an average-pooling, or a min-pooling) or down-sampling operation (e.g., low-pass filter and decimation). The skip-connector can feed the output from layer to skip one or more succeeding layers to the following layer. The up-sampler can perform a dimension expansion of the input, using an up-sampling operation (e.g., via zero-packing and interpolation). Each of the convolutional layers 605 can be arranged in series with one another, with an output of one layer fed forward as the input as the succeeding layer. The last of the convolutional layers 605 can form a spatial pooler (e.g., a down-sampler) to combine the feature maps from previous convolutional layers 605 and of the decoder 155 to generate the output recovered data matrix 525. Each layer can have a non-linear, input-to-output characteristic. Each of the convolutional layers 605 can include a convolutional layer, a normalization layer, and an activation layer (e.g., a rectified linear unit (ReLU), softmax function, or a sigmoid function), among others.

With the generation, the model trainer 125 can compare the recovered data matrix 525 against the corresponding original data matrix 510 to calculate, generate, or otherwise determine at least one loss metric 610. The model trainer 125 can also compare the recovered message 530 with the original message 505 to determine the loss metric 610. The model trainer 125 can retrieve or identify the data matrix 510 with which to compare based on the input original image 205 from the same example in the training dataset 165. The loss metric 610 can indicate or identify a degree of deviation of the recovered data matrix 525 outputted by the decoder 155 and the expected, data matrix 510 (e.g., on a bit-by-bit basis). The degree of deviation can, for example, correspond to a discrepancy in pixel-by-pixel color values between the recovered data matrix 525 and the original data matrix 510. The model trainer 125 can calculate the loss metric 610 in accordance with any number of loss functions, such as a norm loss (e.g., L1 or L2), mean squared error (MSE), a quadratic loss, a cross-entropy loss, Wasserstein loss, and a Huber loss, among others. In general, the higher the degree in deviation of the recovered data matrix 525 from the original data matrix 510, the higher the loss metric 610 can be. Conversely, the lower the degree in the deviation, the lower the loss metric 610 can be.

Using the loss metric 610, the model trainer 125 can modify, set, or otherwise update the set of weights in the decoder 155, such as the weights in the set of convolutional layers 605. The updating of weights can be in accordance with an optimization function (or an objective function) for the decoder 155. The optimization function can define one or more rates or parameters at which the weights of the decoder 155, including the set of convolutional layers 605, are to be updated. The updating of the parameters in can be repeated until a convergence condition, using the examples of the training dataset 165. For example, the model trainer 125 can determine whether the training of the decoder 155 is completed based on an amount of change in the weights from one training epoch from a prior training epoch. With the establishment of the decoder 155, the model applier 130 can sue the decoder 155 to decode data matrices corresponding to secret messages from cover images during runtime mode.

In addition, the model trainer 125 can use or apply a critic technique in determining the loss metrics (e.g., the loss metrics 320 and 610). For example, the model trainer 125 can initiate or establish a critic network to determine whether the sample encoded image 515 is encoded with the data matrix 510. The critic network can include a set of weights to relate at least one input to at least one output. For instance, the critic network can include a set of convolution layers (e.g., similar to the convolutional layers 310 or 605) and a down-sampler (e.g., a max pooling operation) in a series configuration. The model applier 130 can feed or input an image (e.g., the sample encoded image 515) into the critic network. From feeding, the critic network can output, determine, or otherwise classify the input image (e.g., the sample encoded image 515) as encoded or non-encoded.

With the output, the model trainer 125 can compare the classification from the critic network with a classification of the image. When the input image is the sample encoded image 515, the classification is encoded with a message. If the classifications match, the model trainer 125 can determine that the output of the critic network is correct. Otherwise, if the classifications do not match, the model trainer 125 can determine that the output of the critic network is incorrect. Using the comparisons, the model trainer 125 can calculate or determine a loss metric (e.g., Wasserstein loss). The loss metric can correspond to a perceptual loss for the images passed through the encoder 150 and the decoder 155. The model trainer 125 can use the loss metric calculated from the critic network to update the weights of the critic network. The model trainer 125 can also use the loss metric to update the weights of the encoder 150 and the decoder 155.

Figure 7:
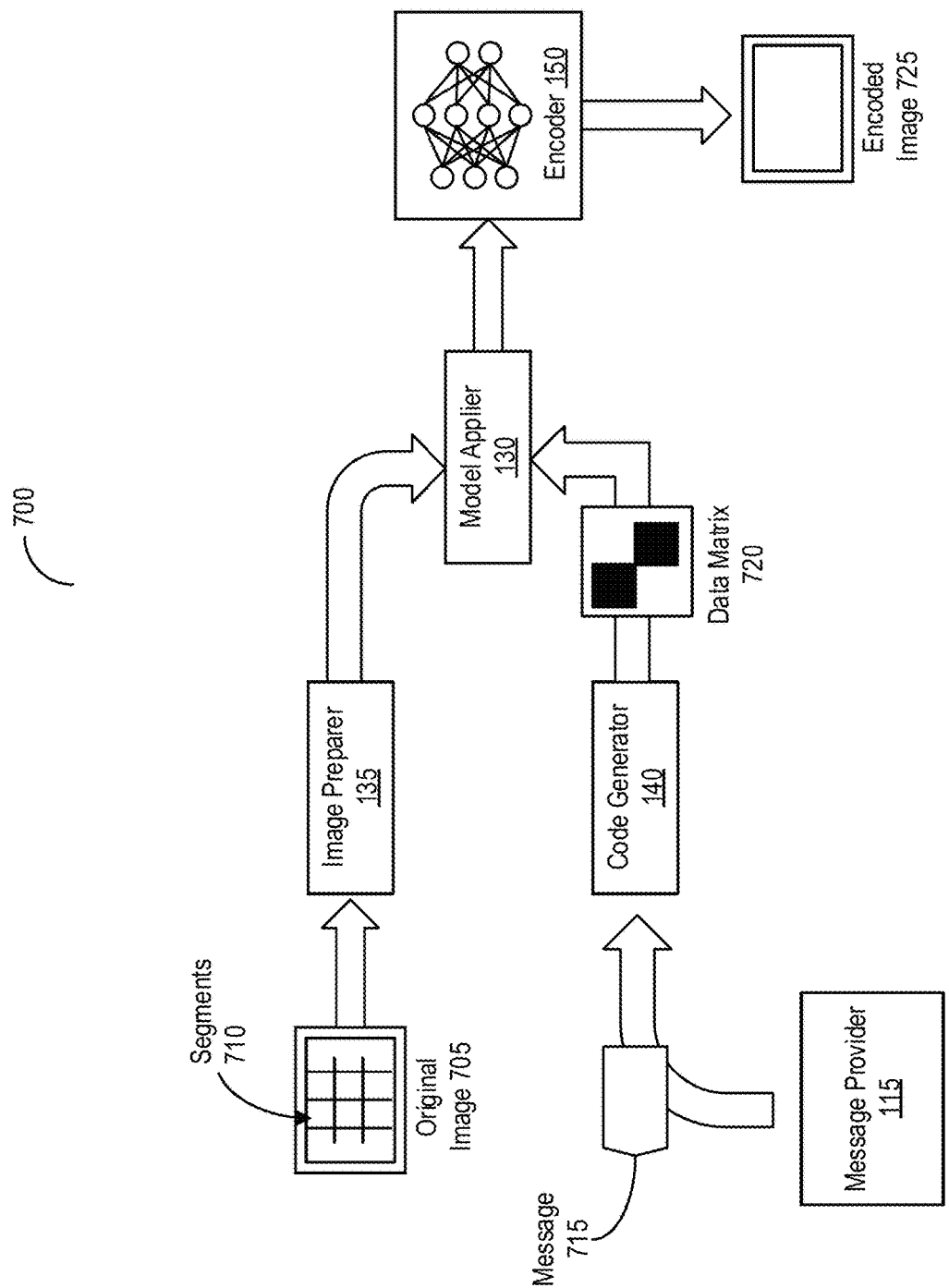
FIG. 7 depicts a block diagram of a process to generating encoded images in the system for encoding messages into images in accordance with an illustrative embodiment.

FIG. 7 depicts a block diagram of a process 700 to generate encoded images in the system for encoding messages into images. The process 700 can include or correspond to operations performed in the system 100 to encode messages into images during runtime mode. Under the process 700, the image preparer 135 can retrieve, receive, or otherwise identify at least one original image 705. The original image 705 can be similar to the original image 205 discussed above. The image preparer 135 can access the database 160 to fetch or retrieve the original image 705 to which to encode. For example, the image preparer 135 can receive a request identifying the original image 705 from a user input/output (I/O) device connected with the data processing system 105. Upon receipt, the image preparer 135 can retrieve the original image 705 from the database 160 accessible to the data processing system 105. The image preparer 135 can retrieve or receive the original image 705 from another source, such as the message provider 115. The message provider 115 can transmit, send, or otherwise provide the original image 705 (or an identification of at least one file corresponding to the original image 705) to the image preparer 135.

The original image 705 can be provided or retrieved from a data source by the image preparer 135. The original image 705 can correspond to at least one image file in any format, such as a bitmap (BMP), a Joint Photographic Experts Group (JPEG) format, a Graphics Interchange Format (GIF), Portable Network Graphics (PNG) format, Scalable Vector Graphics (SVG) format, or a Tag Image File Format (TIFF), among others. The original image 705 can correspond to at least one frame in a video in any format, such as a Moving Picture Experts Group (MPEG), a QuickTime Movie (MOV), Windows Media Viewer (WMV), or Audio Video Interleave (AVI), among others. The image preparer 135 can identify at least one of the frames to which to use as the original image 705.

The original image 705 can have a set of pixels in two-dimensions (e.g., having x by y pixels) or three-dimensions (e.g., having x by y by z pixels). Each pixel in the set of pixels in the original image 705 can have a value identified or defined in a color space (sometimes herein referred to as a color model). The color space can define a set of color values (or chromaticity) in accordance with a mapping. The color space can include, for example, a red-green-blue (RGB) color space, a cyan-magenta-yellow-key (CMYV) color space, a hue-saturation-lightness (HSL) color space, or a hue-saturation-brightness (HSB) color space, among others. The color space can be comprised of a set of channels. Each channel can correspond to a respective color value in the set. The arrangement of color values in the color space can form an n-tuple for the set. For example, if an RGB color space is used for the pixels of the original image 705, the set of color values can include a red value, a green value, and a blue value. In this example, one channel can correspond to the red value, another channel can correspond to the green value, and another channel can correspond to the blue value.

With the identification, the image preparer 135 can produce, output, or otherwise generate the set of image segments 710 from the original image 705. The image preparer 135 can identify the original image 705 from which to form the image segments 710. Each image segment 710 can correspond to a portion of the set of pixels of the original image 705. Each image segment 710 can be encoded with a data matrix corresponding to a secret message as detailed herein below. The image preparer 135 can partition or divide the original image 705 to form the image segments 710. Each image segment 710 can be defined to fit an input size of the encoder 150. The input size can be of any dimensions, for instance, 100×100, 200×200, 400×400, or 800×1600 pixels, among others. The set of image segments 710 can be non-overlapping or overlapping in accordance with a set ratio (e.g., 10-90% overlap) between adjacent pairs of the image segments 710.

In conjunction, the code generator 140 can retrieve, receive, or otherwise identify at least one message 715 to encode into the original image 705. The message 715 can be provided by the message provider 115. The message provider 115 can send, transmit, or otherwise provide a request to encode to the code generator 140. The request can identify or include the original image 705 and the message 715 to encode into the original image 705. The message 715 can correspond to or include any data in the form of text, another image, audio, or other files to be encoded into the original image 705. The message 715 can include a resource identifier (e.g., a Uniform Resource Locator (URL)) corresponding to an information resource (e.g., a webpage). The resource identifier of the message 715 can refer to the information resource associated with the message provider 115.

With the identification, the code generator 140 can produce, output, or otherwise generate the data matrix 720 using the message 715. The generation of the data matrix 720 can be similar to the generation of the data matrix 220 using the message 215. The code generator 140 can transform or convert the message 715 into a word (e.g., a binary string). The code generator 140 can select or identify at least a portion of the message 715 (in original form or binary string) to use for error correction. Using at least the identified portion of the message 715, the code generator 140 can determine, output, or otherwise generate an error correction code in accordance with an error correction code algorithm. The error correction code algorithm can include, for example, a block code or a convolutional code, among others, such as those discussed above. The error correction code can also be another word (e.g., a binary string). The code generator 140 can add or combine the error correction code with the word corresponding to the message 715 in accordance with the error correction code algorithm to output, form, or otherwise generate the data matrix 720. The word for the data matrix 720 can include one or more portions corresponding to the message 715 and one or more portions corresponding to the error correction code.

The model applier 130 can apply the original image 705 and the data matrix 720 to the encoder 150. The processing of the image 705 and data matrix 720 using the encoder 150 can be similar to the processing of the image 205 in using the encoder 150 discussed above. The model applier 130 can apply each image segment 710 of the image 705 along with the data matrix 720 to the encoder 150. To apply, the model applier 130 can aggregate, join, or otherwise combine the original image 705 (or each image segment 710) and the data matrix 720 to output, produce, or otherwise generate at least one input to feed to the encoder 150. Upon feeding, the model applier 130 can process the input in accordance with the set of weights of the encoder 150 to produce or generate at least one encoded image 725. The model applier 130 can also gather, combine, or aggregate outputs from applying each image segment 710 to form or generate the encoded image 725. Each output can correspond to a respective input image segment 710, and the encoded image 725 can be formed by the model applier 130 using the combination of the outputs.

The encoded image 725 can correspond to the original image 705 encoded with the data matrix 720 corresponding to the message 715. The encoded image 725 can have a set of pixels in two-dimensions (e.g., having x by y pixels) or three-dimensions (e.g., having x by y by z pixels) of the same size as the original image 705. The encoded image 725 can be formed using the set of image segments 710. Each image segment 710 can be encoded with the data matrix 720. Each pixel in the set of pixels in the encoded image 725 can have a value identified or defined in the same color space as the original image 705. By extension, the set of channels for the pixels of the encoded image 725 can be defined in the same color space as the set of channels for the pixels of the original image 705. For instance, if a RGB color space is used for the pixels of the original image 705, the encoded image 725 can also be in the RGB color space, and can have set of channels corresponding to red, green, and blue values respectively.

The data matrix 720 can be encoded across the set of channels in the color space in the encoded image 725. For example, if the color space of the encoded image 725 is RGB, a portion of the data matrix 720 can be embedded across the pixels of the encoded image 725 the red channel, a portion of the data matrix 720 can be embedded across the pixels in the green channel, and a portion of the data matrix 720 can be embedded across the pixels in the blue channel. The data matrix 720 can be encoded or embedded in at least a portion of the set of pixels of the encoded image 725. With the embedding, the portion of the set of pixels corresponding to the data matrix 720 in the encoded image 725 can differ from the set of pixels of the original image 705 in terms of color value.

With the generation, the model applier 130 can store and maintain the encoded image 725 on the database 160 (e.g., in the form of a file or data structures). The model applier 130 can also store and maintain an association among the encoded image 725 with the original image 705, the message 715, or the data matrix 725, or any combination thereof. The association can also identify a source of the original image 705 from which the encoded image 725 is derived and a source of the message 715 (e.g., the message provider 115) embedded in the channels of the color space of the encoded image 725. The association can be maintained using one or more data structures, such as an array, a table, a matrix, a linked list, a tree, a heap, a hash table, or a graph, among others, on the database 160.

In addition, the model applier 130 can send, transmit, or otherwise provide the encoded image 725. The model applier 130 can transmit the encoded image 725 to the message provider 115 that provided the message 715 to be encoded into the original image 705. The model applier 130 can provide the encoded image 725 to an input/output (I/O) device, such as a display or printer to output the encoded image 725 on an output surface (e.g., paper or monitor screen). The model applier 130 can provide the encoded image 725 to be scanned, obtained, or otherwise acquired by the sensor 175 of the client 110 for decoding the message 715 from the encoded image 725. Due to the media through which the encoded image 725 is presented, the acquired version of the encoded image 725 as obtained by the client 110 via the sensor 175 can differ from originally provided encoded image 725 generated by the encoder 150.

Figure 8:
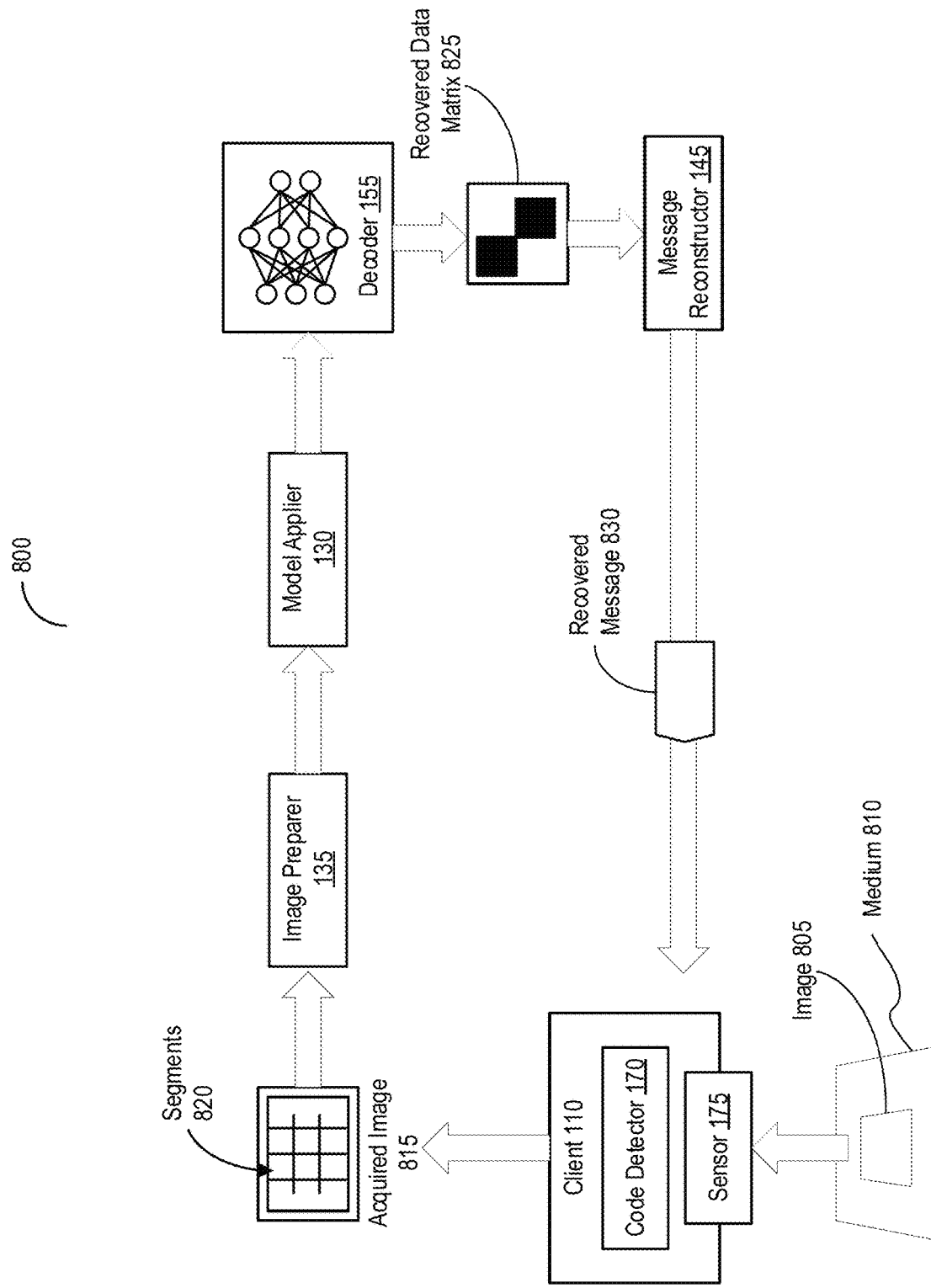
FIG. 8 depicts a block diagram of a process to recovering messages in the system for encoding messages into images in accordance with an illustrative embodiment.

FIG. 8 depicts a block diagram of a process 800 to recover messages in the system for encoding messages into images. The process 800 can include or correspond to operations performed in the system 100 to decode messages from images during runtime mode. Under the process 800, the code detector 170 executing on the client 110 can scan, obtain, or otherwise acquire at least one image 805 via the sensor 175. The image 805 can correspond to the encoded image 725 as discussed above, and may have been generated by the encoder 150 to encode a data matrix corresponding to a secret message. The image 805 can be situated, arranged, or otherwise disposed on at least one medium 810. The medium 810 can correspond to a surface upon which the image 805 is disposed. The medium 810 can, for example, include a display screen presenting the image 805 or a piece of paper or film with the image 805 imprinted thereon. To acquire, the sensor 175 can be positioned generally in front of a side of the medium 810 with the image 805. The code detector 170 running on the client 110 can use the sensor 175 to capture the image 805 on the medium 810 to generate at least one acquired image 815. Due to the acquisition, the set of pixels of the acquired image 815 can have a degree of deviation (e.g., as measure by color value) from the set of pixels of the original encoded image (e.g., the encoded image 725).

With the acquisition, the code detector 170 can identify or otherwise determine whether the acquired image 815 is encoded. The determination can be based on one or more visual characteristics of the acquired image 815. The visual characteristics can include an amount of noise, contrast, and diffusion, among others. The code detector 170 can analyze, evaluate, or otherwise process the acquired image 815 to determine the visual characteristics. With the determination, the code detector 170 can compare the visual characteristics with set characteristics correlated with an encoded image to determine whether the acquired image 815 is encoded. The determination of the visual characteristic and comparison may be performed by the code detector 170 in accordance with light weight algorithms with less computational requirements than the encoder 150 or the decoder 155.

When the visual characteristics of the acquired image 815 are correlated with encoded images, the code detector 170 can determine that the acquired image 815 is not encoded. The code detector 170 can refrain from further processing the acquired image 815. Otherwise, when the visual characteristics of the acquired image 815 are correlated with encoded images, the code detector 170 can determine that the acquired image 815 is encoded. The code detector 170 can also send, transmit, or otherwise provide the acquired image 815 to the data processing system 105 for additional analysis. The functionalities of the code detector 170 can be performed on the data processing system 105, with the client 110 providing the acquired image 815 to the data processing system 105 to determine whether the acquired image 815 is encoded.

In addition, the code detector 170 can be implemented with a machine learning (ML) model, such as a semantic segmentation network (e.g., a bilateral segmentation network). The model implanting the code detector 170 can recognize one or more portions within the acquired image 815 encoded with a message. The code detector 170 can be trained using a dataset of randomly transformed data matrices (e.g., the data matrix 220 or 510) with various perturbation encoded into images. With the training, the code detector 170 can identify the image segments encoded with the data matrix from a large image. For example, the code detector 170 can fit a quadrilateral to a convex hull of a proposed region with the encoding. The code detector 170 can then compute a homography to warp each quadrilateral to a set size image (e.g., 400×400 image segment) for further parsing and processing by the decoder 155. The code detector 170 can also check for spatial perturbations in the acquired image to form image segments identified as encoded.

The image preparer 135 can retrieve, identify, or otherwise receive the acquired image 815 from the client 110. The receipt can be in response to the code detector 170 running on the client 110 determining that the acquired image 815 is encoded. With the receipt, the image preparer 135 can produce, output, or otherwise generate the set of image segments 820 from the acquired image 815. As discussed above, each image segment 820 can correspond to a portion of the set of pixels of the acquired image 815. The image preparer 135 can partition or divide the acquired image 815 to form the image segments 820. Each image segment 820 can be defined to fit an input size of the decoder 155. The input size can be of any dimensions, for instance, 100×100, 200×200, 400×400, or 800×1600 pixels, among others. The set of image segments 820 can be non-overlapping or overlapping in accordance with a set ratio (e.g., 10-90% overlap) between adjacent pairs of the image segments 820.

The model applier 130 can apply each image segment 820 of the image 815 to the decoder 155. Upon feeding, the model applier 130 can process the input in accordance with the set of weights of the decoder 155 to derive, extract, or otherwise identify at least one recovered data matrix 825. The processing of the image 815 using the decoder 155 can be similar to the processing of the sample encoded image 515 using the decoder 155 as discussed above. The recovered data matrix 825 can be generated by the decoder 155 to be similar to the sample encoded image 225. The outputs correspond to a respective input image segment 820, and the recovered data matrix 825 can be repeated throughout each image segment 820 from the sample encoded image 815.

The recovered data matrix 825 can correspond to the data matrix (e.g., the data matrix 720) for the message (e.g., the message 715) encoded into the sample encoded 815 that is attempted to be decoded using the decoder 155. The recovered data matrix 825 can be similar to the data matrix 720 detailed herein above. The data matrix 825 can identify or include a word (e.g., a binary string of any length) based on the message (e.g., the message 715) encoded into the original image 705 and the error correction code used to generate the original data matrix from at least a portion of the message. The data matrix 720, for example, can be a 100-bit long binary message, with 72 bits corresponding to the message and the remaining bits corresponding to the error correction code. The error correction code used for the recovered data matrix 825 can include, for example, a block code or a convolutional code as discussed above.

The message reconstructor 155 executing on the data processing system 105 can produce, output, or otherwise generate at least one recovered message 830 using the recovered data matrix 825. The message reconstructor 145 can retrieve, receive, or otherwise identify the recovered data matrix 825 outputted by the decoder 145. With the identification, the message reconstructor 145 can analyze, evaluate, or otherwise parse the recovered data matrix 825 to extract, identify, or generate the word (e.g., the binary string). The word can at least partially correspond to the message used to generate the original, data matrix (e.g., the data matrix 720). The word can contain or include one or more portions corresponding to the original message (e.g., the message 715) and one or more portions corresponding to the error correction code (e.g., block code or convolutional code).

In accordance with the error correction algorithm, the message reconstructor 155 can determine whether the word contains any errors (e.g., incorrect parity). In determining, the message reconstructor 145 can select or identify one or more portions of the word corresponding to the error correction code. By comparing the error correction code with the remaining portions corresponding to the original message, the message reconstructor 145 can determine whether the word from the recovered data matrix 825 contains any errors. If there are no errors detected (e.g., correct parity), the message reconstructor 145 can continue processing the word from the recovered data matrix 825. If there are any errors, the message reconstructor 145 can rectify, correct, or otherwise modify one or more portions of the words with the errors in accordance with the error correction code. With corrections (if any), the message reconstructor 145 can select or identify at least a remaining portion of the word as the recovered message 830. The recovered message 830 can identify or include a reference identifier (e.g., a URL) corresponding to an information resource (e.g., a webpage).

With the identification, the message reconstructor 145 can store and maintain the recovered data matrix 825 or the recovered message 830 on the database 160 (e.g., in the form of a file or data structures). The message reconstructor 145 can also store and maintain an association among the recovered message 830 with the acquired image 815, individual image segments 820, recovered data matrices 825, or any combination thereof. The association can also identify a source of the acquired image 815 (e.g., a network address, a device identifier, or an account identifier corresponding to the client 110). The association can be maintained using one or more data structures, such as an array, a table, a matrix, a linked list, a tree, a heap, a hash table, or a graph, among others, on the database 160. The message reconstructor 145 can also perform any actions as specified in the recovered message 830. For instance, if the recovered message 830 includes computer instructions, the message reconstructor 145 can invoke other components in the data processing system 105 to execute in accordance with the instructions.

In addition, the message reconstructor 145 can send, transmit, or otherwise provide the recovered message 830. The message reconstructor 145 can transmit the recovered message 830 to the client 110 that provided the acquired image 815 to the data processing system 105. With the receipt, the client 110 can provide, display, or otherwise present the recovered message 830. For example, the client 110 can display the text in the recovered message 830 decoded from the acquired image 815. The client 110 can also perform any actions as identified in the recovered message 830. For example, the recovered message 830 can include or identify the resource identifier corresponding to the information resource. Upon reading the resource identifier, the client 110 can invoke a web browser to access the information resource via the resource identifier as identified in the recovered message 830. The web browser on the client 110 can load the information resource corresponding to the resource identifier for presentation.

Figure 9:
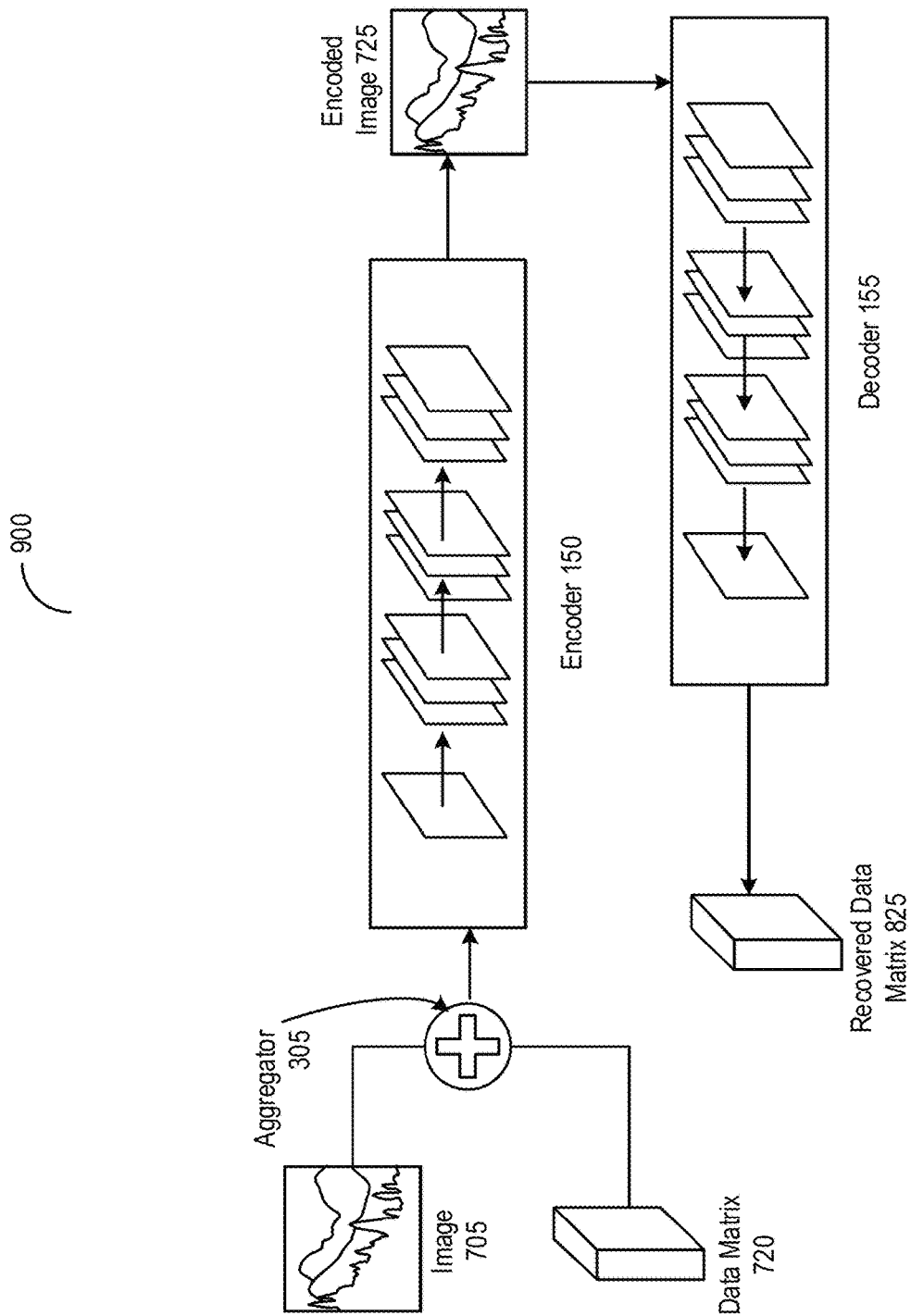
FIG. 9 depicts a block diagram of a process of encoding messages into images and decoding messages from images in the system in accordance with an illustrative embodiment.

FIG. 9 depicts a block diagram of a process 900 to encode messages into images and decoding messages from images in the system. The process 900 can include or correspond to operations in the system 100 to encode messages into images and decode the messages from the images, and can include the operations discussed above with respect to processes 700 and 800. Under the process 900, the aggregator 305 can join, concatenate, or otherwise combine the original image 705 and the data matrix 720 to generate a data tensor. The data matrix 720 can be generated from the message 715 to be encoded into the image 705. The encoder 150 can process the data tensor in accordance with the set of weights to generate the encoded image 725. The set of weights can be defined using the set of convolutional layers 310 and the set of deconvolutional layers 315. At the other end, the decoder 155 can process the encoded image 725 (or the acquired image 815 corresponding to the encoded image 725) in accordance with the set of weights to generate the recovered data matrix 825. From the recovered data matrix 825, the message 715 used to generate the encoded image 725 can be reconstructed.

Figure 10:
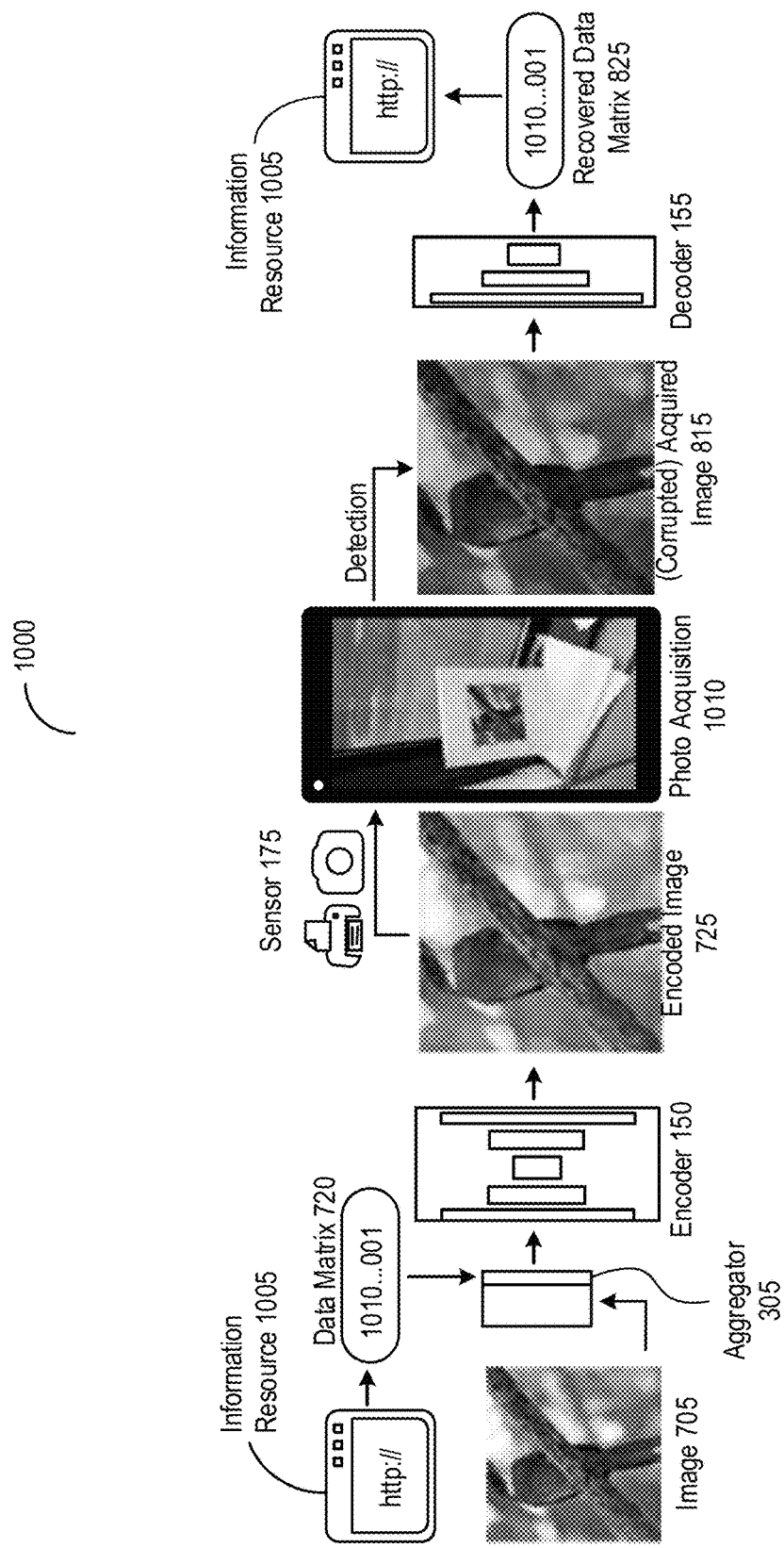
FIG. 10 depicts a block diagram of a process of encoding resource identifiers into images and decoding resource identifiers from acquired in the system in accordance with an illustrative embodiment.

FIG. 10 depicts a block diagram of a process 1000 to encode resource identifiers into images and decoding resource identifiers from acquired in the system. The process 1000 can include or correspond to operations in the system 100 to encode messages into images and decode the messages from the images, and can include the operations discussed above with respect to processes 700 and 800. Under the process 1000, the aggregator 305 can join, concatenate, or otherwise combine the original image 705 and the data matrix 720 to generate a data tensor. The data matrix 720 can correspond to the message 715 including a reference identifier corresponding to at least one information resource 1005 (e.g., a webpage). The encoder 150 can process the data tensor in accordance with the set of weights to generate the encoded image 725. The sensor 175 on the client 110 can perform a photo acquisition 1010 to generate the acquired image 815. The decoder 155 can process the acquired image 815 in accordance with the set of weights to generate the recovered data matrix 825. From the recovered data matrix 825, the message 715 used to generate the encoded image 725 can be reconstructed. Using the reference identifier in the message 715, the client 110 can access and load the information resource 1005.

In this manner, the encoder 150 can learn and be trained to use the original image 705 to generate encoded image 725 of high quality and robustness to carry and convey the data matrix 720 corresponding to the message 715 embedded therein. Since the data matrix 720 is embedded across the channels of the color space of the pixels in the encoded image 720, the data matrix 720 can be embedded and successfully decoded even when the color values lack variation and are near-pure tone. The error correction code in the data matrix 720 can allow the encoded image 725 to be degraded, while still permitting recovery of the message 715. Furthermore, the decoder 155 can be trained to be robust and tolerant to artefacts introduced to the acquired image 805 from various factors such as noise, cropping, degradation of the medium 805, among others, when identifying the recovered data matrix 825. With these foundations, the encoder 150 and decoder 155 thus can improve hiding of secret messages 715 within images 705, increasing the probability of successful recovery from the encoded images 725 (and corresponding acquired images 815).

Figure 11:
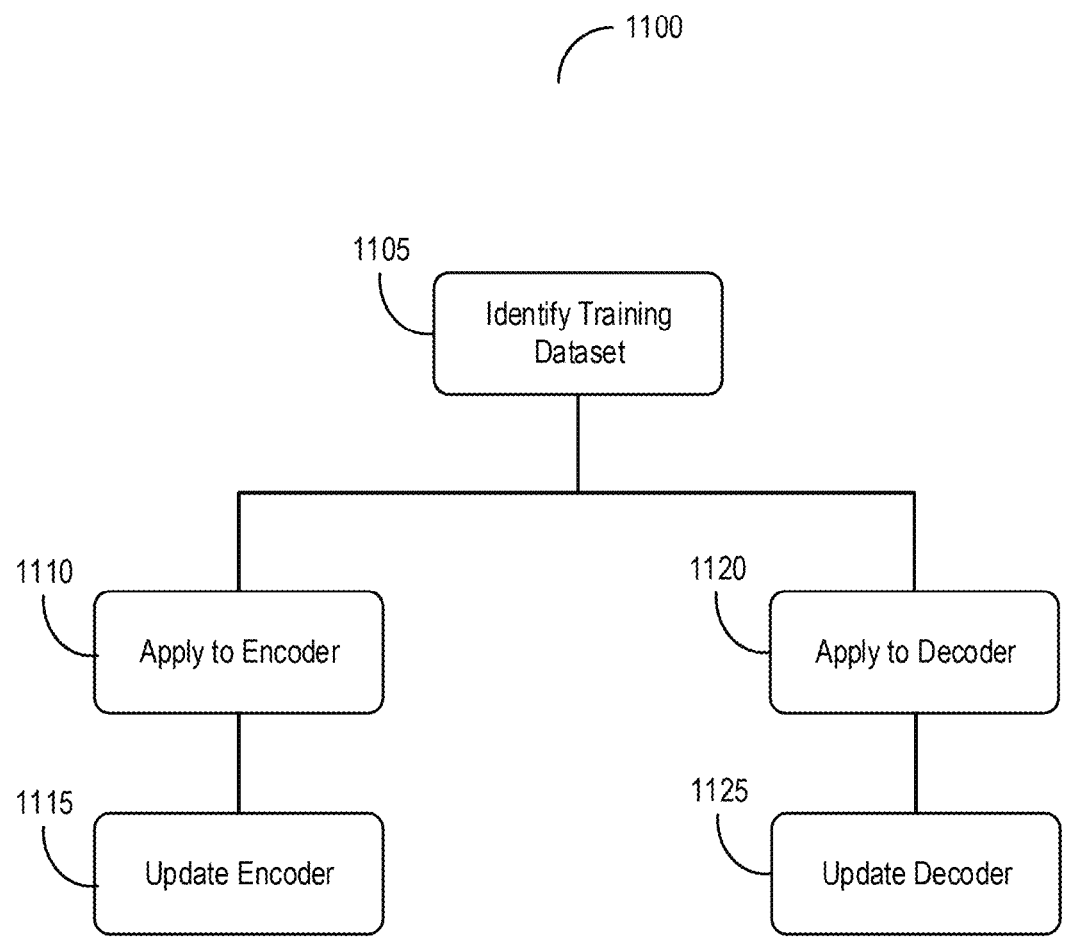
FIG. 11 depicts a flow diagram of a method of training encoders and decoders for messages associated with images in accordance with an illustrative embodiment.

FIG. 11 depicts a flow diagram of a method 1100 of training encoders and decoders for messages associated with images. The method 1100 can be implemented or performed using any of the components as discussed herein above in conjunction with FIGS. 1-10. The data processing system 105 can identify the training dataset 165 (ACT 1105). The training dataset 165 can identify or include a set of examples to train the encoder 150 and the decoder 155. Each example can include the original image 205, the message 215 or 505, the data matrix 220 or 510 corresponding to the message 215 or 505, and the sample encoded image 225 or 515. The original image 205 can have a set of pixels in two or more dimensions, in a color space (e.g., RGB) with a set of channels (e.g., R, G, and B channels). The sample encoded image 225 or 515 can correspond to the image 205 encoded with the data matrix 220 or 510 across the set of channels in the color space of the image 205. The data matrix 220 or 510 can be a word (e.g., a binary string) generated using the message 215 or 505 in accordance with an error correction code algorithm.

The data processing system 105 can apply the encoder 150 (ACT 1110). In applying, the data processing system 105 can use the aggregator 305 to combine the original image 205 with the data matrix 220 to generate a data sensor. With the generation, the data processing system 105 can process the data tensor in accordance with the set of weights of the encoder 150. The set of weights can be defined using the set of convolutional layers 310 and the set of deconvolutional layers 315. From processing the data tensor using the set of weights of the encoder 150, the data processing system 105 can generate an encoded image 230.

The data processing system 105 can update the encoder 150 (ACT 1115). The data processing system 105 can compare the encoded image 230 generated using the encoder 150 with the corresponding sample encoded image 225 from the training dataset 165. Based on the comparison, the data processing system 105 can determine the loss metric 230. The loss metric 320 can correspond to a level of deviation (e.g., pixel-level color value) of the encoded image 230 from the sample encoded image 225. Using the loss metric 230, the data processing system 105 can modify or update the set of weights of the encoder 150, including the set of convolution layers 310 or the set of deconvolutional layers 315.

The data processing system 105 can apply the decoder 155 (ACT 1120). In applying, the data processing system 105 can feed the sample encoded image 515 into the decoder 155. From feeding, the data processing system 105 can process the input, sample encoded image 515 according to the set of weights in the decoder 155. The set of weights of the decoder 155 can be defined using the set of convolutional layers 605. By processing, the data processing system 105 can use the decoder 155 to extract or identify the recovered data matrix 525. The recovered data matrix 525 can include a word corresponding to the message and the error correction code.

The data processing system 105 can update the decoder 155 (ACT 1125). The data processing system 105 can compare the recovered data matrix 525 generated using the decoder 155 with the corresponding sample data matrix 510 from the training dataset 165. Based on the comparison, the data processing system 105 can determine the loss metric 610. The loss metric 610 can correspond to a level of deviation (e.g., binary values) of the recovered data matrix 525 from the sample data matrix 510. Using the loss metric 610, the data processing system 105 can modify or update the set of weights of the decoder 155, including the set of convolutional layers 605.

Figure 12:
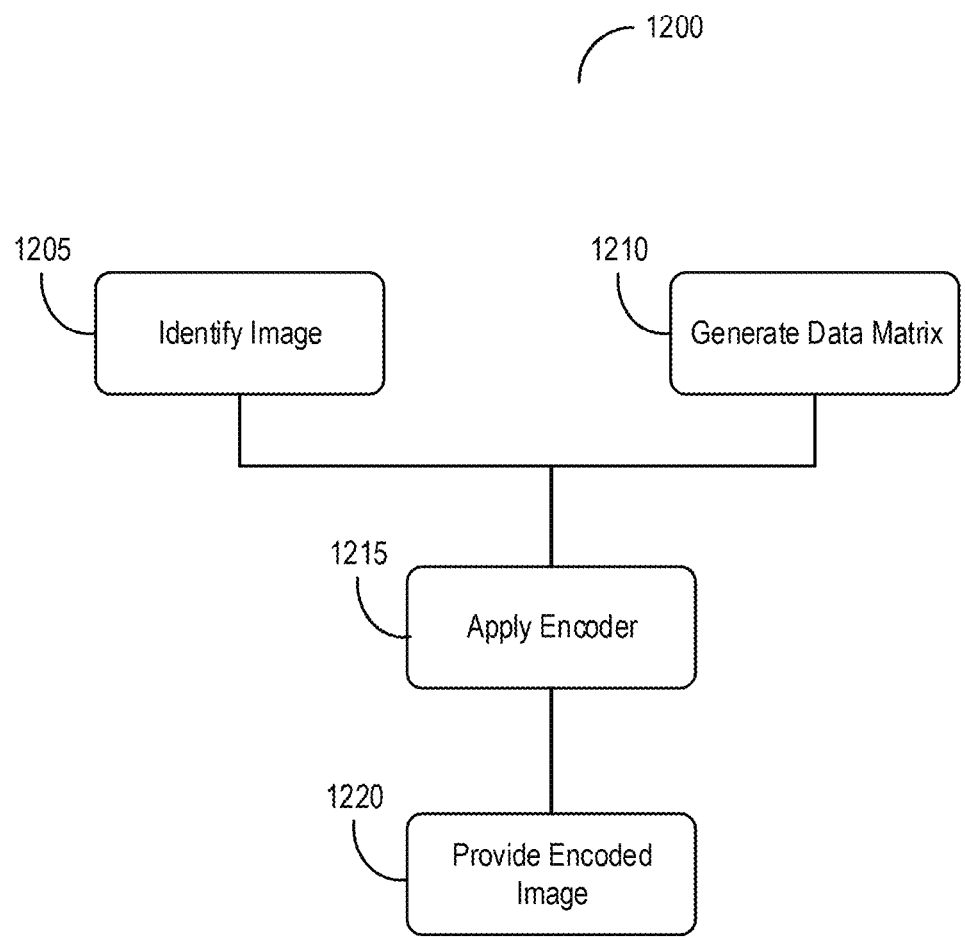
FIG. 12 depicts a flow diagram of a method of encoding messages into images in accordance with an illustrative embodiment.

FIG. 12 depicts a flow diagram of a method 1200 of encoding messages into images. The method 1200 can be implemented or performed using any of the components as discussed herein above in conjunction with FIGS. 1-10. The data processing system 105 can identify the original image 705 (ACT 1205). The original image 705 can have a set of pixels in two or more dimensions, in a color space (e.g., RGB) with a set of channels (e.g., R, G, and B channels). Each pixel in the set of pixels in the original image 705 can have a value identified or defined in a color space (sometimes herein referred to as a color model).

The data processing system 105 can generate the data matrix 720 (ACT 1210). The data matrix 720 can be generated using the message 715 in accordance with an error correction code algorithm. The data matrix 720 can include a word (e.g., a binary string) corresponding to the message 715 and the error correction code. In the data matrix 720, one or more portions of the word can correspond to the message 715 (e.g., a binary representation thereof) and one or more remaining portions can correspond to the error correction code.

The data processing system 105 can apply the encoder 150 (ACT 1215). In applying, the data processing system 105 can use the aggregator 305 to combine the original image 705 with the data matrix 720 to generate a data sensor. With the generation, the data processing system 105 can process the data tensor in accordance with the set of weights of the encoder 150. The set of weights can be defined using the set of convolutional layers 310 and the set of deconvolutional layers 315. From processing the data tensor using the set of weights of the encoder 150, the data processing system 105 can generate an encoded image 725.

The data processing system 105 can provide the encoded image (ACT 1220). The encoded image 725 can correspond to the original image 705 encoded with the data matrix 720 corresponding to the message 715. The encoded image 725 can have a set of pixels in the same number of dimensions as the original image 705. Each pixel in the set of pixels in the encoded image 725 can have a value identified or defined in the same color space as the original image 705. The data matrix 720 can be encoded across the set of channels in the color space in the encoded image 725.

Figure 13:
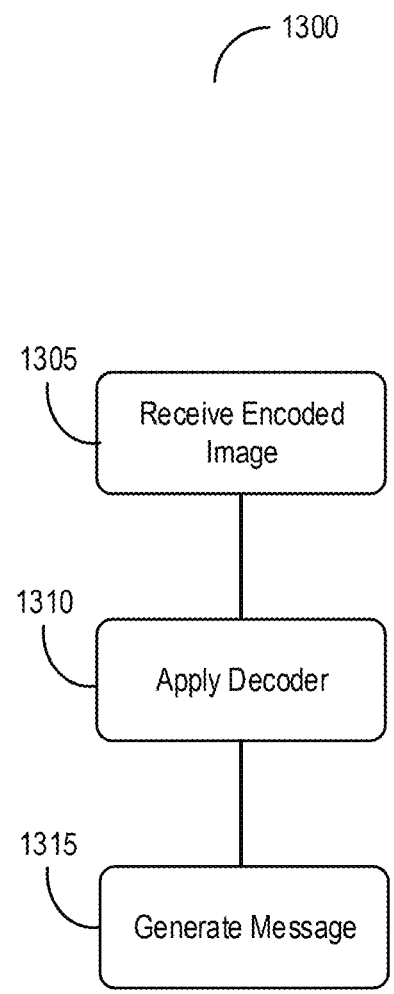
FIG. 13 depicts a flow diagram of a method of encoding messages into images in accordance with an illustrative embodiment.

FIG. 13 depicts a flow diagram of a method 1300 of encoding messages into images. The method 1300 can be implemented or performed using any of the components as discussed herein above in conjunction with FIGS. 1-10. The data processing system 105 can receive the encoded image 815 (ACT 1305). The encoded image 815 can correspond to the image 805 presented on the medium 810. The encoded image 815 be acquired via the sensor 170 on the client 110. The client 110 can determine whether the encoded image 815 is encoded based on visual characteristics. If determined to be encoded, the client 110 can transmit the encoded image 815 to the data processing system 105.

The data processing system 105 can apply the decoder 155 (ACT 1310). In applying, the data processing system 105 can feed the encoded image 815 into the decoder 155. From feeding, the data processing system 105 can process the input, encoded image 815 according to the set of weights in the decoder 155. The set of weights of the decoder 155 can be defined using the set of convolutional layers 605. By processing, the data processing system 105 can use the decoder 155 to extract or identify the recovered data matrix 825. The recovered data matrix 825 can include a word corresponding to the message and the error correction code.

The data processing system 105 can generate the message 830 (ACT 1315). The data processing system 105 can generate the message 830 from the recovered data matrix 825 in accordance with the error correction algorithm. Upon the identification, the data processing system 105 can correct one or more portions in the word (e.g., the binary string) in the recovered data matrix 825 according to the error correction algorithm. With the correction (if any), the data processing system 105 can extract the portion of the word in the data matrix 825 and output the extracted portion as the recovered message 830.

FIG. 14 depicts a block diagram of an example computer system 1400. The computer system or computing device 1400 can include or be used to implement the data processing system 110 and its components, the client. The computing system 1400 includes at least one bus 1405 or other communication component for communicating information and at least one processor 1410 or processing circuit coupled to the bus 1405 for processing information. The computing system 1400 can also include one or more processors 1410 or processing circuits coupled to the bus for processing information. The computing system 1400 also includes at least one main memory 1415, such as a random access memory (RAM) or other dynamic storage device, coupled to the bus 1405 for storing information, and instructions to be executed by the processor 1410. The computing system 1400 may further include at least one read only memory (ROM) 1420 or other static storage device coupled to the bus 1405 for storing static information and instructions for the processor 1410. A storage device 1425, such as a solid state device, magnetic disk or optical disk, can be coupled to the bus 1405 to persistently store information and instructions. The storage device 1425 can include or be part of the database of the data processing system 105.

The computing system 1400 may be coupled via the bus 1405 to a display 1435, such as a liquid crystal display, or active matrix display, for displaying information to a user. An input device 1430, such as a keyboard or voice interface may be coupled to the bus 1405 for communicating information and commands to the processor 1410. The input device 1430 can include a touch screen display 1435. The input device 1430 can also include a cursor control, such as a mouse, a trackball, or cursor direction keys, for communicating direction information and command selections to the processor 1410 and for controlling cursor movement on the display 1435.

The processes, systems and methods described herein can be implemented by the computing system 1400 in response to the processor 1410 executing an arrangement of instructions contained in main memory 1415. Such instructions can be read into main memory 1415 from another computer-readable medium, such as the storage device 1425. Execution of the arrangement of instructions contained in main memory 1415 causes the computing system 1400 to perform the illustrative processes described herein. One or more processors in a multi-processing arrangement may also be employed to execute the instructions contained in main memory 1415. Hard-wired circuitry can be used in place of or in combination with software instructions together with the systems and methods described herein. Systems and methods described herein are not limited to any specific combination of hardware circuitry and software.

Although an example computing system has been described in FIG. 14, the subject matter including the operations described in this specification can be implemented in other types of digital electronic circuitry, or in computer software, firmware, or hardware, including the structures disclosed in this specification and their structural equivalents, or in combinations of one or more of them.

Some of the description herein emphasizes the structural independence of the aspects of the system components (e.g., various modules of the system 100, such as the data processing system 105, client 110, and message provider 115 as described in FIGS. 1-10) and illustrates one grouping of operations and responsibilities of these system components. Other groupings that execute similar overall operations are understood to be within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "data processing system" "computing device" "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

What is claimed is:

1. A system to encode messages into images comprising:
    at least one server having one or more processors coupled with memory to:
        identify a first image having a first plurality of pixels in a color space having a set of channels;
        generate, using a message to encode in the first image, a data matrix identifying a plurality of values;
        add, to the message to generate the data matrix, an error correction code determined based at least on a portion of the message; and
        apply a machine learning (ML) model comprising a plurality of convolutional layers to the first image and to the data matrix to generate a second image having a second plurality of pixels in the color space, the second image corresponding to the first image encoded with the data matrix across the set of channels in the color space.

2. The system of claim 1, comprising:
    the at least one server to generate, from a third image, a plurality of image segments including at least the first image, each of the plurality of image segments to be encoded with the message.

3. The system of claim 1, comprising:
    the at least one server to generate, from application of the ML model on a first plurality of image segments and the data matrix, a second plurality of image segments to form the second image, each of the second plurality of image segments encoded with the data matrix across the set of channels in the color space.

4. The system of claim 1, comprising:
    the at least one server to concatenate the plurality of values identified by data matrix to the first plurality of pixels of the image as a channel separate from the set of channels of the color space.

5. The system of claim 1, comprising:
    the at least one server to receive the message including a resource identifier corresponding to an information resource.

6. The system of claim 1, comprising:
    the at least one server to provide the second image to be acquired by a sensor of a client device to decode the message, the second plurality of pixels of the second image having a degree of deviation from the first plurality of pixels of the first image within a threshold.

7. A system to decode messages from images comprising:
    at least one server having one or more processors coupled with memory to:
    receive, from a client device, an image having a plurality of pixels in a color space having a set of channels across which a data matrix is encoded, responsive to the client device determining that the image is encoded;
    apply a machine learning (ML) model comprising a plurality of convolutional layers to the image to identify the data matrix decoded from the plurality of pixels of the color space;
    generate a message using a plurality of values of the data matrix decoded from the image; and
    recover the message in accordance with an error correction code in the plurality of values of the data matrix.

8. The system of claim 7, comprising:
    the at least one server to identify, from a second image acquired by a sensor of the client device, a plurality of image segments including at least the image, at least one of the plurality of image segments encoded with the message.

9. The system of claim 7, comprising:
    the at least one server to determine, based on a visual characteristic of the image, that the image is encoded, the plurality of pixels of the image having a degree of deviation from a second plurality of pixels of a second image within a threshold, the second image generated using a third image and the message.

10. The system of claim 7, comprising:
    the at least one server to provide, to the client device, the message decoded from image.

11. The system of claim 7, comprising:
    the at least one server to identify a resource identifier corresponding to an information resource included in the message to provide to the client device.

12. The system of claim 7, comprising:
    the at least one server to store an association between the image and the message decoded from the image.

* * * * *